United States Patent
Tsuruta et al.

(10) Patent No.: US 12,202,996 B2
(45) Date of Patent: Jan. 21, 2025

(54) COPPER OXIDE INK AND METHOD FOR PRODUCING CONDUCTIVE SUBSTRATE USING SAME, PRODUCT CONTAINING COATING FILM AND METHOD FOR PRODUCING PRODUCT USING SAME, METHOD FOR PRODUCING PRODUCT WITH CONDUCTIVE PATTERN, AND PRODUCT WITH CONDUCTIVE PATTERN

(71) Applicant: Asahi Kasei Kabushiki Kaisha, Tokyo (JP)

(72) Inventors: Masanori Tsuruta, Tokyo (JP); Toru Yumoto, Tokyo (JP)

(73) Assignee: Asahi Kasei Kabushiki Kaisha, Tokyo (JP)

( * ) Notice: Subject to any disclaimer, the term of this patent is extended or adjusted under 35 U.S.C. 154(b) by 0 days.

(21) Appl. No.: 18/199,739

(22) Filed: May 19, 2023

(65) Prior Publication Data

US 2023/0374329 A1 Nov. 23, 2023

Related U.S. Application Data

(62) Division of application No. 16/633,396, filed as application No. PCT/JP2018/028238 on Jul. 27, 2018, now Pat. No. 11,760,895.

(30) Foreign Application Priority Data

| Jul. 27, 2017 | (JP) | 2017-145187 |
| Jul. 27, 2017 | (JP) | 2017-145188 |
| Feb. 13, 2018 | (JP) | 2018-023239 |

(51) Int. Cl.
C09D 11/52 (2014.01)
B05D 3/06 (2006.01)
(Continued)

(52) U.S. Cl.
CPC ............ C09D 11/52 (2013.01); B05D 3/06 (2013.01); B05D 3/145 (2013.01); C09D 11/033 (2013.01); C09D 11/037 (2013.01); H01Q 1/38 (2013.01)

(58) Field of Classification Search
CPC ..... C09D 11/02; C09D 11/033; C09D 11/037; C09D 11/52; B05D 3/06; B05D 3/145; H01B 1/02; H01B 1/22; H01B 1/026
(Continued)

(56) References Cited

U.S. PATENT DOCUMENTS

| 4,868,034 A | 9/1989 | Steinberg |
| 2004/0185388 A1 | 9/2004 | Hirai |

(Continued)

FOREIGN PATENT DOCUMENTS

| CN | 102137728 A | 7/2011 |
| CN | 102585602 A | 7/2012 |

(Continued)

OTHER PUBLICATIONS

International Search Report issued in corresponding International Patent Application No. PCT/JP2018/028238 dated Oct. 30, 2018.
(Continued)

Primary Examiner — Tri V Nguyen
(74) Attorney, Agent, or Firm — Morgan, Lewis & Bockius LLP

(57) ABSTRACT

In the present invention, a conductive film having low resistance is formed on a substrate, said film having excellent storage stability and high dispersion stability as an ink. A copper oxide ink (1) contains a copper oxide (2), a dispersant (3), and a reducing agent. The content of the reducing agent is in the range of formula (1), and the content of the dispersant is in the range of formula (2). (1) 0.00010≤ (reducing agent mass/copper oxide mass)≤0.10 (2) 0.0050≤
(Continued)

(dispersant mass/copper oxide mass)≤0.30 The reducing agent content promotes the reduction of copper oxide to copper during firing, and promotes the sintering of copper.

12 Claims, 6 Drawing Sheets

(51) Int. Cl.
  *B05D 3/14* (2006.01)
  *C09D 11/033* (2014.01)
  *C09D 11/037* (2014.01)
  *H01Q 1/38* (2006.01)

(58) Field of Classification Search
  USPC .......... 252/506, 512, 519.3; 106/31.65, 31.9, 106/31.92
  See application file for complete search history.

(56) References Cited

U.S. PATENT DOCUMENTS

| | | |
|---|---|---|
| 2004/0211979 A1 | 10/2004 | Shioiri et al. |
| 2005/0069648 A1 | 3/2005 | Maruyama |
| 2005/0189136 A1 | 9/2005 | Kawasaki et al. |
| 2006/0098065 A1* | 5/2006 | Maruyama ............... C01G 3/02 347/100 |
| 2008/0166502 A1 | 7/2008 | Nakamae |
| 2009/0181184 A1 | 7/2009 | Pope et al. |
| 2009/0258202 A1 | 10/2009 | Sakaguchi et al. |
| 2010/0129566 A1 | 5/2010 | Lee et al. |
| 2011/0155432 A1 | 6/2011 | Tomonari et al. |
| 2012/0092220 A1 | 4/2012 | Tani et al. |
| 2012/0170241 A1* | 7/2012 | Nakako ................ C09D 11/322 977/773 |
| 2012/0205698 A1 | 8/2012 | Yamazaki et al. |
| 2012/0267151 A1 | 10/2012 | Hojo et al. |
| 2013/0074728 A1 | 3/2013 | Ishikawa et al. |
| 2014/0199204 A1 | 7/2014 | Kaneshiro et al. |
| 2014/0242362 A1 | 8/2014 | Nakako et al. |
| 2014/0367619 A1 | 12/2014 | Summers |
| 2014/0377457 A1 | 12/2014 | Liu et al. |
| 2015/0024120 A1 | 1/2015 | Uchida |
| 2015/0118413 A1 | 4/2015 | Kawato et al. |
| 2016/0024316 A1 | 1/2016 | Sasada et al. |
| 2016/0024317 A1 | 1/2016 | Hayata et al. |
| 2016/0029483 A1 | 1/2016 | Kawato et al. |
| 2016/0086688 A1 | 3/2016 | Hongo et al. |
| 2016/0128201 A1 | 5/2016 | Ciufo et al. |
| 2016/0155814 A1 | 6/2016 | Ogawa et al. |
| 2017/0118836 A1 | 4/2017 | Kim et al. |
| 2017/0140847 A1 | 5/2017 | Kamikoriyama et al. |
| 2018/0171159 A1 | 6/2018 | Ooi et al. |

FOREIGN PATENT DOCUMENTS

| | | |
|---|---|---|
| CN | 103733277 A | 4/2014 |
| CN | 103842295 A | 6/2014 |
| CN | 104588643 A | 5/2015 |
| EP | 0316886 A2 | 5/1989 |
| EP | 2785158 A1 | 10/2014 |
| EP | 3127969 A1 | 2/2017 |
| JP | S54-009793 A | 1/1979 |
| JP | S60-244093 A | 12/1985 |
| JP | S63-081997 A | 4/1988 |
| JP | H01-129492 A | 5/1989 |
| JP | H01-220303 A | 9/1989 |
| JP | H02-174145 A | 7/1990 |
| JP | H05-041575 A | 2/1993 |
| JP | H07-014427 A | 1/1995 |
| JP | 2003-163446 A | 6/2003 |
| JP | 2004-119686 A | 4/2004 |
| JP | 2004-168561 A | 6/2004 |
| JP | 2004-253794 A | 9/2004 |
| JP | 2004-327703 A | 11/2004 |
| JP | 2005-071805 A | 3/2005 |
| JP | 2005-191077 A | 7/2005 |
| JP | 2007-080720 A | 3/2007 |
| JP | 2008-193067 A | 8/2008 |
| JP | 2009-283547 A | 12/2009 |
| JP | 2011-054748 A | 3/2011 |
| JP | 2011-104815 A | 6/2011 |
| JP | 2012-009753 A | 1/2012 |
| JP | 2012-85215 A | 4/2012 |
| JP | 2012-142318 A | 7/2012 |
| JP | 2012-186155 A | 9/2012 |
| JP | 2012-216425 A | 11/2012 |
| JP | 2013-72091 A | 4/2013 |
| JP | 2013-109966 A | 6/2013 |
| JP | 2013-115004 A | 6/2013 |
| JP | 2014-011126 A | 1/2014 |
| JP | 2014-041969 A | 3/2014 |
| JP | 2014-91149 A | 5/2014 |
| JP | 2014-167872 A | 9/2014 |
| JP | 2014-222611 A | 11/2014 |
| JP | 2015-008136 A | 1/2015 |
| JP | 2015-018675 A | 1/2015 |
| JP | 2015-210973 A | 11/2015 |
| JP | 2016-014181 A | 1/2016 |
| JP | 2016-527665 A | 9/2016 |
| JP | 2016-176146 A | 10/2016 |
| JP | 2019-67514 A | 4/2019 |
| KR | 10-2012-0008019 A | 1/2012 |
| WO | 03/051562 A1 | 6/2003 |
| WO | 2004/050559 A1 | 6/2004 |
| WO | 2010/119787 A | 10/2010 |
| WO | 2014/017323 A1 | 1/2014 |
| WO | 2014/119498 A1 | 8/2014 |
| WO | 2015/012264 A1 | 1/2015 |
| WO | 2015/050589 A2 | 4/2015 |
| WO | 2015/166755 A1 | 11/2015 |
| WO | 2016/195047 A1 | 12/2016 |
| WO | WO-2018016445 A1 * | 1/2018 ............... C01G 3/02 |

OTHER PUBLICATIONS

International Preliminary Report on Patentability and Written Opinion issued in corresponding International Patent Application No. PCT/JP2018/028238 dated Jan. 28, 2020.
Supplementary European Search Report issued in related European Patent Application No. 18767041.9 dated Dec. 16, 2020.
Extended European Search Report issued in corresponding European Patent Application No. 21187184.3 dated Oct. 28, 2021.
PubChem "Lecithin from Soybean" <<https://pubchem.ncbi.nlm.nih.gov/compound/Lecithin-from-Soybean>> accessed May 7, 2022 (2022).
Jha "Solution phase synthesis and intense pulsed light sintering and reduction of a copper oxide ink with an encapsulating nickel oxide barrier," Nanotechnology, 26: 175601 (2015).

* cited by examiner

COPPER OXIDE INK AND METHOD FOR PRODUCING CONDUCTIVE SUBSTRATE USING SAME, PRODUCT CONTAINING COATING FILM AND METHOD FOR PRODUCING PRODUCT USING SAME, METHOD FOR PRODUCING PRODUCT WITH CONDUCTIVE PATTERN, AND PRODUCT WITH CONDUCTIVE PATTERN

FIELD

The present invention relates to a copper oxide ink and a method for manufacturing a conductive substrate using the same, a product containing a coating film and a method for manufacturing a product using the same, a method for manufacturing a product with a conductive pattern, and a product with a conductive pattern.

BACKGROUND

Circuit boards have a configuration in which a conductive circuit is provided on a substrate. The method for manufacturing a circuit board is generally as follows. First, photoresist is applied to the substrate with metal foil pasted thereto. Then, the photoresist is exposed to light and developed, and a negative shape of the desired circuit pattern is obtained. Then, the metal foil on portions not covered in photoresist is removed by chemical etching to form a pattern. Thus, a high-performance circuit board can be manufactured.

However, the conventional method has the flaws of requiring many steps, being complicated, and requiring a photoresist material.

In contrast, there has been more focus on direct circuit printing technology (hereinafter referred to as the PE (printed electronics) method) wherein a dispersion in which microparticles selected from a group consisting of metal microparticles and metal oxide microparticles are dispersed is used to directly print a desired circuit pattern on a substrate. This technology has few steps and does not require the use of photoresist materials, so it has extremely high productivity.

The dispersion can be a metal ink or a metal paste. The metal ink is a dispersion in which metal ultrafine particles with an average particle size of several to tens of nanometers are dispersed in a dispersion medium. After the metal ink is applied to the substrate and dried, if heat treatment is performed, due to the decrease in the particular melting point of the metal ultrafine particles, sintering at a temperature lower than the melting point of the metal can be performed, and a metal film having conductivity (hereinafter referred to as a conductive film) can be formed. The metal film obtained using metal ink has a thin film thickness and is similar to a metal foil.

The metal paste is a dispersion in which micrometer-sized metal microparticles, and a binder resin are dispersed in a dispersion medium together. The size of the microparticles is large, so to prevent settling, the dispersion is normally supplied at a rather high viscosity. Therefore, it is suitable for application by a dispenser or a screen printer which is suited to materials with high viscosities. The metal paste has metal particles with large sizes, so it has the characteristic of forming thick metal films.

Copper is focused on as a metal to be used in the above metal particles. In particular, copper is the most desirable as an alternative to ITO (indium tin oxide), which is widely used as an electrode material for projected capacitive touch panels, from the perspective of resistivity, ion (electrochemical) migration, performance as a conductor, price, and reserve capacity.

However, oxidation occurs readily for the ultrafine particles of copper on the scale of tens of nanometers; thus, antioxidation treatment is necessary. There was the problem that antioxidation treatment hindered sintering.

In order to solve this problem, using ultrafine particles of copper oxide as a precursor, reducing the copper oxide to copper by energy such as heat or active light rays in a suitable atmosphere, and forming a thin copper film was proposed (for example, refer to PTL 1).

Since the surface diffusion itself of the ultrafine particles of copper oxide occurs at a temperature lower than 300° C., if the copper oxide is reduced to copper by an energy in a suitable atmosphere, the ultrafine copper particles mutually form fine random chains due to sintering, and the whole becomes a network whereby the desired electrical conductivity is obtained.

Additionally, PTL 2 proposes a copper oxide dispersion demonstrating excellent stability over the passage of time, and being able to form a conductive film with an intricate pattern.

CITATION LIST

Patent Literature

PTL 1: WO2003/051562
PTL 2: WO2015/012264

SUMMARY

Technical Problem

The thin metal film obtained by the PE method using a metal ink or metal paste is required to not only have a low resistivity, but also demonstrate little change over time. For example, regarding silver pastes, it is known that silver oxidizes readily in the atmosphere, and resistivity rises upon oxidation, whereby the resistivity between silver particles worsens over time.

However, there is no prior art examining the stability of resistivity for a metal film obtained by the PE method disclosed in PTL 1 using ultrafine particles of copper oxide as the precursor.

Additionally, regarding industrial applicability, the dispersion is required to have excellent dispersion stability relative to changes over time at high concentrations.

The present invention has an object, out of consideration of the above circumstances, of providing a copper oxide ink which has high dispersion stability as an ink, has excellent storage stability, and can form a conductive film with low resistance on a substrate, and a method for manufacturing a conductive substrate using the same, a product containing a coating film and a method for manufacturing a product using the same, a method of manufacturing a product with a conductive pattern and a product with a conductive pattern.

Solution to Problem

The copper oxide ink of one aspect of the present invention comprises a copper oxide, a dispersant, and a reducing agent, wherein the content of the reducing agent is in the range of formula (1) below, and the content of the dispersant is in the range of formula (2) below.

$$0.00010 \leq (\text{mass of reducing agent/mass of copper oxide}) \leq 0.10 \quad (1)$$

$$0.0050 \leq (\text{mass of dispersant/mass of copper oxide}) \leq 0.30 \quad (2)$$

The copper oxide ink of one aspect of the present invention comprises cuprous oxide, a dispersant, and a reducing agent, wherein the dispersant has an acid value of not less than 20 and not more than 130, and is phosphorus-containing organic matter, the content of the dispersant is in the range of formula (1) below, the reducing agent comprises at least one selected from hydrazine and hydrazine hydrate, and the content of the reducing agent is in the range of formula (2) below.

$$0.00010 \leq (\text{mass of reducing agent/mass of copper oxide}) \leq 0.10 \quad (1)$$

$$0.0050 \leq (\text{mass of dispersant/mass of copper oxide}) \leq 0.30 \quad (2)$$

The product comprising a coating film of one aspect of the present invention comprises a copper oxide, a dispersant, and a reducing agent, wherein the content of the reducing agent is within the range of formula (1) below, and the content of the dispersant is within the range of formula (2) below.

$$0.00010 \leq (\text{mass of reducing agent/mass of copper oxide}) \leq 0.10 \quad (1)$$

$$0.0050 \leq (\text{mass of dispersant/mass of copper oxide}) \leq 0.30 \quad (2)$$

The product comprising a coating film of one aspect of the present invention comprises cuprous oxide, a dispersant, and a reducing agent, wherein the dispersant has an acid value of not less than 20 and not more than 130, and is phosphorus-containing organic matter, the content of the dispersant is in the range of formula (1) below, the reducing agent comprises at least one selected from hydrazine and hydrazine hydrate, and the content of the reducing agent is in the range of formula (2) below.

$$0.00010 \leq (\text{mass of reducing agent/mass of copper oxide}) \leq 0.10 \quad (1)$$

$$0.0050 \leq (\text{mass of dispersant/mass of copper oxide}) \leq 0.30 \quad (2)$$

The method for manufacturing a conductive substrate of one aspect of the present invention comprises subjecting a pattern formed on a substrate using the above copper oxide ink to firing treatment by generating plasma under an atmosphere comprising a reductive gas.

The method for manufacturing a conductive substrate of one aspect of the present invention comprises the steps of using the above copper oxide ink to form a coating film on a substrate; and irradiating the coating film with laser light.

The method for manufacturing a conductive substrate of one aspect of the present invention comprises the steps of: using the above copper oxide ink to form a coating film on a substrate; and irradiating the coating film with xenon light.

The method for manufacturing a product of one aspect of the present invention comprises using the above product comprising a coating film, and subjecting the product to firing treatment by generating plasma in an atmosphere comprising a reductive gas to obtain a conductive pattern.

The method for manufacturing a product of one aspect of the present invention comprises the steps of: using the above product comprising a coating film; and irradiating the product with laser light to obtain a conductive pattern.

The method for manufacturing a product of one aspect of the present invention comprises the steps of: using the above product comprising a coating film; and irradiating the product with xenon light to obtain a conductive pattern.

The product with a conductive pattern of one aspect of the present invention comprises a substrate, a cuprous oxide-containing layer formed on the surface of the substrate, and a conductive layer formed on the surface of the cuprous oxide-containing layer, wherein the conductive layer has a circuit with a line width of not less than 1.0 µm and not more than 1000 µm, and the circuit comprises reduced copper.

The product with a conductive pattern of one aspect of the present invention comprises a substrate, a cuprous oxide-containing layer formed on the surface of the substrate, and a conductive layer formed on the surface of the cuprous oxide-containing layer, wherein the conductive layer has a circuit with a line width of not less than 1.0 µm and not more than 1000 µm, and the circuit comprises reduced copper, copper, and tin.

The product with a conductive pattern of one aspect of the present invention comprises a substrate, and a conductive layer formed on the surface of the substrate, wherein the conductive layer has a circuit with a line width of not less than 1.0 µm and not more than 1000 µm, and the circuit comprises reduced copper, phosphorus, and voids.

The product with a conductive pattern of one aspect of the present invention comprises a substrate, and a conductive layer formed on the surface of the substrate, wherein the conductive layer has a circuit with a line width of not less than 1.0 µm and not more than 1000 µm, and the circuit comprises reduced copper, copper, and tin.

The product with a conductive pattern of one aspect of the present invention comprises a substrate, and a conductive layer formed on the surface of the substrate, wherein the conductive layer has a circuit with a line width of not less than 1.0 µm and not more than 1000 µm, the circuit comprises reduced copper, copper oxide, and phosphorus, and a resin is provided so as to cover the circuit.

Advantageous Effects of Invention

According the present invention, a conductive film can be formed wherein its dispersion stability as an ink is high, its storage stability is excellent, and it demonstrates low resistance on the substrate.

BRIEF DESCRIPTION OF DRAWINGS

FIG. 6A is a photograph of a conductive substrate on which a solder layer is formed in the present embodiment.

FIG. 6B is a schematic diagram of FIG. 6A.

DESCRIPTION OF EMBODIMENTS

An embodiment of the present invention (hereinafter abbreviated as "embodiment") will be described in detail below.

Summary of the Copper Oxide Ink of the Present Embodiment

Using a copper oxide ink with high dispersion stability and excellent storage stability enables ease of handling in the atmosphere, as well as control of particle size, concentration, viscosity and solvent, application of all types of printing methods, and firing on general-purpose resin substrates.

In the copper oxide ink of the present embodiment, a dispersant is included to prevent agglomeration of nanoparticles. Furthermore, a small amount of a reducing agent is included in the present embodiment. By including a reducing agent, the reduction of copper oxide to copper is promoted during firing.

As described in PTL 2, reducing agents like hydrazine are actively removed from the copper oxide by the solvent substitution of repeated concentrations and dilutions. Essentially, according to the knowledge of the present inventors at the time of the filing of PTL 2, reducing agents like hydrazine were actively removed from the copper ink by repeated dilutions and concentrations.

In contrast, in the present embodiment, a predetermined amount of reducing agent is included. Conventionally, it was difficult to quantitatively measure a reducing agent if copper oxide nanoparticles which inhibit the quantitative measuring of reducing agents were present. However, after filing PTL 2, the present inventors established a method for quantitatively measuring reducing agents such as hydrazine in a copper oxide ink. Thus, quantitatively measuring of reducing agents such as hydrazine in a copper oxide ink became possible, and the effect of reducing agents like hydrazine in the copper oxide ink could be quantitatively understood. As a result, it was found that reducing agents such as hydrazine contribute to the storage stability of copper oxide ink, whereby the present invention was completed.

Additionally, by establishing a method of quantitatively measured the above reducing agent, a method of actively leaving reducing agents such as hydrazine in the copper oxide ink was discovered. Essentially, it was understood that, when creating the copper oxide ink, by adding a reducing agent like hydrazine under predetermined time/temperature conditions and dispersing in a nitrogen atmosphere, the reducing agent such as hydrazine could be effectively kept in the copper oxide ink.

Figure 1:
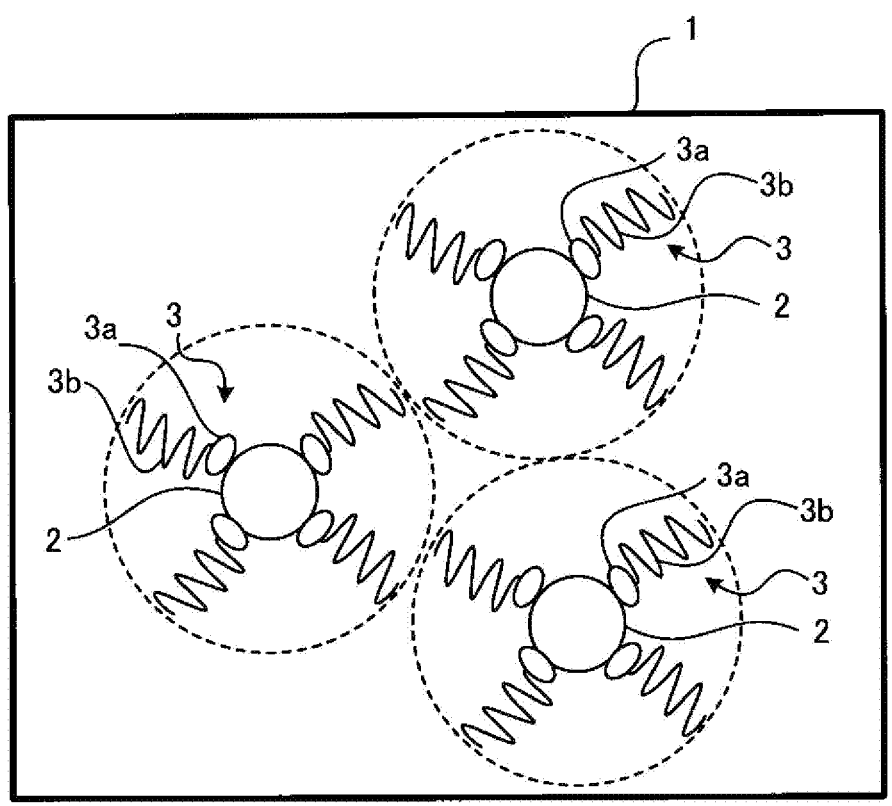
FIG. 1 is a schematic drawing indicating the relationship between the copper oxide and the phosphate ester salt of the present embodiment.

The copper oxide ink of the present embodiment will be explained in detail below. FIG. 1 is a schematic diagram indicating the relationship between the copper oxide and phosphate ester salt of the present embodiment. FIG. 2A, FIG. 2B, FIG. 2C and FIG. 2D are schematic diagrams indicating a conductive substrate of the present embodiment.

<Copper Oxide Ink>

The copper oxide ink of the present embodiment comprises (1) a copper oxide, (2) a dispersant, and (3) a reducing agent in a dispersion medium. By including the reducing agent in the copper oxide ink, the reduction of the copper oxide to copper during firing is promoted, and sintering of copper is promoted.

"Copper oxide ink" is an ink or a paste comprising a copper oxide dispersed in a dispersion medium. The copper oxide ink can be referred to as a dispersion.

"Reducing agent" is an agent having a reduction activity on copper oxide, promoting reduction to copper. The reducing agent is selected from substances having a stronger reduction activity than the dispersant or the dispersion medium.

"Dispersion medium" functions as a solvent. "Dispersion medium", depending on the substance, can correspond to two or more of a dispersant, a reducing agent, and a dispersion medium, or if equivalent to any of the above, is defined as a dispersion medium in the present embodiment.

"Dispersant" contributes to dispersion within a dispersion medium by ensuring copper oxide particles do not agglomerate.

The content of the reducing agent satisfies the range of formula (1) below.

$$0.00010 \leq (\text{mass of reducing agent/mass of copper oxide}) \leq 0.10 \quad (1)$$

Thus, if the mass ratio of the reducing agent is not less than 0.00010, reduction occurs more during firing and the resistance of the copper film decreases. Further, in the present embodiment, by setting the content of the reducing agent to formula (1) above, the storage stability can be improved. The principle by which storage stability is improved is not known, it is considered that either A. the reducing agent consumes oxygen or B. the reducing agent controls the zeta potential of the copper oxide particles. Additionally, if the reducing agent is not more than 0.10, the storage stability of copper oxide ink improves. The range is preferably from not less than 0.0010 to not more than 0.050, more preferably not less than 0.0010 to not more than 0.030, even more preferably not less than 0.0020 to not more than 0.030, or most preferably not less than 0.0040 to not more than 0.030.

The content of the dispersant is in the range of formula (2) below.

$$0.0050 \leq (\text{mass of dispersant/mass of copper oxide}) \leq 0.30 \quad (2)$$

In this range, agglomeration of copper oxide is restricted and dispersion stability is improved. The range is preferably from not less than 0.050 to not more than 0.30, more preferably not less than 0.10 to not more than 0.30, even more preferably not less than 0.20 to not more than 0.30, or most preferably not less than 0.20 to not more than 0.25.

The acid value of the dispersant is preferably not less than 20 and not more than 130. In this range, the dispersion stability of copper oxide ink is improved. Within this range, the average particle size of copper oxide can be not less than 3.0 nm and not more than 50 nm. The acid value of the dispersant is more preferably not less than 25 and not more than 120, even more preferably not less than 36 and not more than 110, and most preferably not less than 36 and not more than 101.

By limiting the ranges of the masses of the reducing agent and the dispersant relative to copper oxide in this configuration, dispersion stability and storage stability improve, and the resistance of the conductive film effectively decreases. In particular, by setting the content of the reducing agent to the formula (1) above, the storage stability improved relative to PTL 2. Thus, it was found that by setting the content of the reducing agent to the formula (1) above by establishing a method of quantitative measurement for the reducing agent, storage stability can be improved.

By limiting the range of the acid value of the dispersant, the dispersion stability effectively improved. Additionally, since firing treatment can be performed using plasma, light, or laser light, organic matter in the copper oxide is decomposed, firing of the copper oxide is promoted, and a conductive membrane with a low resistance can be formed. This enables the provision of various types of copper wiring, such as wiring for transmitting electrical current, heat dissipation, electromagnetic shielding, and circuits. Additionally, copper oxide has antibacterial/antifungal properties.

By setting the particle size of copper oxide to the above range, low temperature firing becomes possible, such that the copper generated by reduction can be easily sintered. Additionally, since firing treatment can be performed using plasma, light, or laser light, organic matter in the copper oxide is decomposed, firing of the copper oxide is promoted, a conductive film with a low resistance can be formed, and dispersion stability improves.

Additionally, the copper oxide is preferably cuprous oxide. Thus, the reduction of copper oxide is easier, and the copper generated by reduction can be easily sintered.

The copper oxide ink of the present embodiment preferably comprises the following configuration:
(A) The ink comprises cuprous oxide, a dispersant, and a reducing agent.
(B) The dispersant has an acid value of not less than 20, not more than 130, is a phosphorus-containing organic matter, and has a content in the range of formula (2) below.
(C) The reducing agent comprises at least one selected from hydrazine and hydrazine hydrate, and has a content in the range of formula (1) below.

$$0.00010 \leq \text{(mass of reducing agent/mass of copper oxide)} \leq 0.10 \quad (1)$$

$$0.0050 \leq \text{(mass of dispersant/mass of copper oxide)} \leq 0.30 \quad (2)$$

By limiting the ranges of the masses of reducing agent and dispersant relative to copper oxide in this configuration, dispersion stability and storage stability improve, and the resistance of the conductive film effectively decreases. Additionally, by limiting the range of acid value of the dispersant, dispersion stability effectively increases. Furthermore, by using a phosphorus-containing organic matter as the dispersant, dispersion stability improves.

Additionally, the copper oxide ink of the present embodiment preferably comprises cuprous oxide, a dispersant, a reducing agent and a dispersion medium.

Here, the dispersion medium preferably has the following configuration.
(D) The dispersion medium is a mono-alcohol having not more than 7 carbon atoms, and the content of the dispersion medium in the copper oxide ink is not less than 30 mass % and not more than 95 mass %.

This configuration enables low temperature firing. Additionally, since firing treatment can be performed using plasma, light, or laser light, organic matter in the copper oxide is decomposed, firing of the copper oxide is promoted, a conductive membrane with a low resistance can be formed, and dispersion stability improves.

Next, the state of the copper oxide and dispersant in the copper oxide ink will be explained using FIG. 1. As shown in FIG. 1, in the copper oxide ink 1, a phosphate ester salt 3, which is an example of phosphorus-containing organic matter as a dispersant, surrounds the copper oxide 2, which is an example of a copper oxide, with the phosphorus 3a facing the interior side and the ester salt 3b facing the exterior side. Since the phosphate ester salt 3 exhibits electrical insulation, the flow of electricity between the salt and the neighboring copper oxide 2 is inhibited. Additionally, the phosphate ester salt 3 restricts the agglomeration of copper oxide ink 1 by steric hindrance.

Therefore, copper oxide 2 is a semiconductor and an electrical conductor, but since it is covered in phosphate ester salt 3 which exhibits electrical insulation, the copper oxide ink 1 exhibits electrical insulation, and insulation can be achieved between the conductive pattern regions (described later) adjacent to both sides of the copper oxide ink 1 as seen from a cross-section view (a cross-section along the upward-downward direction expressed in FIG. 2A, FIG. 2B, FIG. 2C, and FIG. 2D).

However, regarding the conductive pattern region, a region that is a portion of the coating layer comprising copper oxide and phosphorus-containing organic matter is irradiated with light, and in that region, the copper oxide is reduced to copper. The copper reduced from copper oxide is called reduced copper. In that region, phosphorus-containing organic matter degenerates to a phosphorus oxide. For the phosphorus oxide, organic matter such as the ester salt 3b (refer to FIG. 1) above is decomposed by heat such as from a laser, and no longer exhibits electrical insulation.

Additionally, as shown in FIG. 1, when using copper oxide 2, the copper oxide is sintered while being changed to reduced copper via heat such as from a laser, and neighboring copper oxides 2 integrate with each other. This enables the formation of a region having excellent electrical conductivity characteristics (hereinafter referred to as "conductive pattern region".)

Phosphorus remains in the reduced copper in the conductive pattern region. The phosphorus is present as at least one of a simple substance, phosphates, and phosphorus-containing organic matter. The remaining phosphorus is segregated within the conductive pattern region, such that there is no risk that the resistance in the conductive pattern region becomes large.

[(1) Copper Oxide]

Copper oxide is used as one of the metal oxide components in the present embodiment. The copper oxide is preferably cuprous oxide ($Cu_2O$). It is preferable because, among metal oxides, reduction is easy, sintering is easy using microparticles, it is cheap relative to noble metals such as silver because it is copper, and it is effective against migration.

The preferable range for the average particle size of copper oxide particles is not less than 3.0 nm and not more than 50 nm, more preferably not less than 5.0 nm and not more than 40 nm, or even more preferably not less than 10 nm and not more than 29 nm. When the average particle size is not more than 50 nm, low temperature firing becomes possible, and the general applicability of the substrate widens. Further, it tends to be easier to form intricate patterns on the substrate, which is preferable. Additionally, if the average particle size is not less than 3.0 nm when used in the copper oxide ink, dispersion stability is good, and long-term storage stability of copper oxide ink is improved, which is preferable. Additionally, an evenly thin film can be created. Average particle size is the particle size in the dispersion within the copper oxide ink, and is the value measured by the cumulant method using an FPAR-1000 by Otsuka Electronics Corp. This is not limited to the primary particle size, but can be the secondary particle size.

The polydispersity within the average particle size distribution is preferably in the range from not less than 0.10 to not more than 0.40, or more preferably not less than 0.20 to not more than 0.30. Within this range, the film forms well and dispersion stability is high.

The cuprous oxide can be a commercially available product or can be synthesized. One commercially available product has an average primary particle size of 5 to 50 nm and is made by RMML Co., Ltd. The following methods are methods for synthesis.

(1) A method for heating reduction comprises adding water and a copper acetylacetonate complex to a polyol solvent, heating and dissolving the organic copper compound, then adding water necessary for reaction, and heating up to the reduction temperature of the organic copper.

(2) A method of heating an organic copper compound (copper-N-nitrosophenylhydroxyamine complex) in the presence of a protecting material such as hexadecylamine in an inert atmosphere to a high temperature of about 300° C.

(3) A method of reduction by reducing copper salt dissolved in an aqueous solution with hydrazine.

Of these, method (3) is simple to carry out, and cuprous oxide having a small average particle size can be obtained, so method (3) is preferable. In this reaction, by controlling the temperature and time, the content of reducing agent in the copper oxide ink can be controlled, whereby it is possible to improve the storage stability of the copper oxide ink.

After synthesis, separation of the synthesized solvent and cuprous oxide is performed using a known method such as centrifugal separation. A dispersant and dispersion medium described below are added to the obtained cuprous oxide, which is dispersed under stirring by a known method such as a homogenizer. In particular, by performing the dispersion in an inert atmosphere such as a nitrogen atmosphere, decomposition of the reducing agent such as hydrazine in the obtained cuprous oxide due to oxygen or water can be prevented. The dispersion having copper oxide obtained in this way can be mixed with copper particles and the like in a method described below and used as a copper oxide ink of the present embodiment. The copper oxide ink can be used in printing or painting.

The dispersion medium is preferably a mono-alcohol having 7 or fewer carbon atoms. This restricts the decrease of dispersiveness of the copper oxide, such that copper oxide is more stably dispersed through mutual interaction with the dispersant. Additionally, the resistance value decreases.

The content of the dispersion medium in the copper oxide ink is preferably not less than 30 mass % and not more than 95 mass %. This enables low temperature firing. Since firing treatment can be performed using plasma, light, or laser light, organic matter in the copper oxide can be decomposed, firing of the copper oxide is promoted, such that a conductive film with a low resistance can be formed, and dispersion stability improves.

[(2) Dispersant]

Next, the dispersant will be described. The dispersant of the present invention increases the dispersiveness of the copper oxide in the copper ink. The dispersant can be, for example, phosphorus-containing organic matter. The phosphorus-containing organic matter can be adsorbed on the copper oxide, thereby restricting agglomeration by steric hindrance. Additionally, the phosphorus-containing organic matter is a material demonstrating electrical insulation in the insulating region. The phosphorus-containing organic matter can be an individual substance or a mixture of two or more substances.

The number average molecular weight of the dispersant is not particularly limited, but is preferably 300 to 300,000. If the number average molecular weight is not less than 300, insulation is excellent and dispersion stability of the obtained copper oxide ink is increased; and if the number average molecular weight is not more than 300,000, firing is easy. Additionally, the structure is preferably that of a high molecular weight copolymer of phosphate ester having groups with affinity for copper oxide. For example, the structure of chemical formula (1) is preferable because it is adsorbed onto copper oxide, particularly cuprous oxide, and has excellent adhesion to the substrate. Otherwise, the following compounds can be used as the phosphorus-containing organic compound: phosphines, phosphine oxides, phosphonates, phosphites, or phosphates.

[Chem. 1]

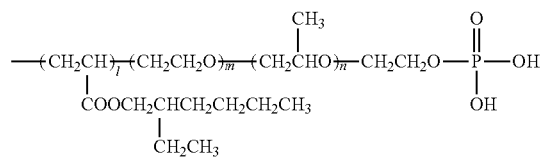

Chemical Formula (1)

In the chemical formula (1), 1 is an integer from 1 to 20, preferably an integer from 1 to 15, more preferably an integer from 1 to 10, m is an integer from 1 to 20, more preferably from 1 to 15, or even more preferably 1 to 10, and n is an integer from 1 to 20, more preferably 1 to 15, or even more preferably 1 to 10. In these ranges, the dispersiveness of copper oxide increases and dispersant is more soluble in the dispersion medium.

In addition to the above, the dispersant can be selected from the following known substances, such as a polymer having a basic group such as a salt of a long-chain polyaminoamide and a polar acid ester, an unsaturated polycarboxylic acid polyaminoamide, a polycarboxylate of polyaminoamide, and a salt of a long-chain polyaminoamide and an acid polymer. Additionally, alkyl ammonium salts, amine salts, and amidoamine salts of polymers such as acrylic polymers, acrylic copolymers, modified polyester acids, polyether ester acids, polyether carboxylic acids, and polycarboxylic acids can be used. Commercially available substances can be used for this dispersant.

Commercially available products include, for example, DISPERBYK(trademark)-101, DISPERBYK-102, DISPERBYK-110, DISPERBYK-111, DISPERBYK-112, DISPERBYK-118, DISPERBYK-130, DISPERBYK-140, DISPERBYK-142, DISPERBYK-145, DISPERBYK-160, DISPERBYK-161, DISPERBYK-162, DISPERBYK-163, DISPERBYK-2155, DISPERBYK-2163, DISPERBYK-2164, DISPERBYK-180, DISPERBYK-2000, DISPERBYK-2025, DISPERBYK-2163, DISPERBYK-2164, BYK-9076, BYK-9077, TERRA-204, and TERRA-U (manufactured by BYK Co.), FLOREN DOPA-15B, FLO- REN DOPA-15BHFS, FLOREN DOPA-22, FLOREN DOPA-33, FLOREN DOPA-44, FLOREN DOPA-17HF, FLOREN TG-662C, and FLOREN KTG-2400 (manufactured by Kyoeisha Chemcial), ED-117, ED-118, ED-212, ED-213, ED-214, ED-216, ED-350, and ED-360 (manufactured by Kusumoto Chemicals, Ltd.), and PLYSURF M208F and PLYSURF DBS (manufactured by Dai-ichi Kogyo Seiyako Co.). These can be used individually or in mixtures of two or more thereof.

It is preferable that the phosphorus-containing organic matter readily decomposes or evaporates upon exposure to light or heat. By using an organic matter that decomposes or evaporates easily upon exposure to light or heat, residue of the organic matter is less likely to remain after firing, and a conductive pattern region with a low resistivity can be obtained.

The decomposition temperature for the phosphorus-containing organic matter is not particularly limited, but is preferably not more than 600° C., more preferably not more than 400° C., and even more preferably not more than 200° C. The boiling point of the phosphorus-containing organic matter is not particularly limited, but is preferably not more than 300° C., more preferably not more than 200° C., and even more preferably not more than 150° C.

The absorption characteristics of the phosphorus-containing organic matter are not particularly limited, but it is preferable that the phosphorus-containing organic matter absorbs light used in firing. For example, if laser light is used as the light source for firing, it is preferable to use to a phosphorus-containing organic matter that absorbs light with the emitted wavelength of, for example, 355 nm, 405 nm, 445 nm, 450 nm, 532 nm, or 1056 nm. If the substrate is a resin, the wavelengths 355 nm, 405 nm, 445 nm, 450 nm, and 532 nm are particularly preferable.

The required amount of dispersant is proportional to the amount of copper oxide, and is adjusted out of consideration of the required dispersion stability. The mass ratio (mass of dispersant/mass of copper oxide) of dispersant included in the copper oxide ink of the present embodiment is not less than 0.0050 and not more than 0.30, preferably not less than 0.050 and not more than 0.30, more preferably not less than 0.10 and not more than 0.30, even more preferably not less than 0.20 and not more than 0.30, or most preferably not less than 0.20 and not more than 0.25. The amount of dispersant influences dispersion stability, such that agglomeration occurs more readily when the amount is low, and dispersion stability improves when the amount is high. However, if the content of dispersant in the copper oxide ink of the present embodiment is not more than 35 mass % the effect of residue deriving from dispersant on the conductive film obtained from firing is limited, and conductivity improves.

The acid value (mgKOH/g) of dispersant is preferably not less than 20 and not more than 130. The acid value of the dispersant is more preferably not less than 25 and not more than 120, even more preferably not less than 36 and not more than 110, or most preferably not less than 36 and not more than 101. If the acid value is in this range, dispersion stability is excellent, which is preferable. It is particularly effective in the case of copper oxide with a small average particle size. Specific examples include "DISPERBYK-102" (acid value 101), "DISPERBYK-140" (acid value 73), "DISPERBYK-142" (acid value 46), "DISPERBYK-145" (acid value 76), "DISPERBYK-118" (acid value 36), and "DISPERBYK-180" (acid value 94) (BYK Co.).

The difference between the amine value (mgKOH/g) and acid value (amine value−acid value) of the dispersant is preferably not less than −50 and not more than 0. The amine value expresses the total amount of free base and base, whereas acid value expresses the total amount of free fatty acid and fatty acid. The amine value and acid value are measured in accordance with JIS K7700 or ASTM D2074. If the difference is not less than −50 to not more than 0, the dispersion stability is excellent, which is preferable. The difference is more preferably not less than −40 and not more than 0, or even more preferably not less than −20 and not more than 0.

The amine value and acid value of the dispersant included in the copper oxide ink can be measured by the following method. The components of the copper oxide ink are collected by liquid chromatography, and amine value and acid value are measured according to the method mentioned above.

[(3) Reducing Agent]

Next, the reducing agent will be explained. The reducing agent here reduces copper oxide to copper. The resultant copper is called "reduced copper".

The reducing agent can be hydrazine, hydrazine hydrate, a hydrazine derivative, sodium, carbon, potassium iodide, oxalic acid, iron(II) sulfide, sodium thiosulfate, ascorbic acid, tin(II) chloride, diisobutylaluminum hydride, formic acid, sodium borohydride, or sulfite. It is preferable that at least one of the above be included. By including at least one of the above, the storage stability of copper oxide is improved, and reduction is promoted, whereby the resistance of the conductive film decreases.

The hydrazine derivative can be a hydrazine salt, an alkyl hydrazine, a pyrazole, a trizole, or a hydrazide. The hydrazine salt can be hydrazine monohydrochloride, hydrazine dihydrochloride, hydrazine monohydrobromide, or hydrazine carbonate. The pyrazole can be 3,5-dimethylpyrazole, or 3-methyl-5-pyrazolone. The triazole can be 4-amino-1,2, 4-triazole, 1,2,4-triazole, 1,2,3-triazole, 1-hydroxybenzotriazole, or 3-mercapto-1,2,4-triazole. The hydrazide can be adipic acid dihydrazide, sebacic acid dihydrazide, dodecanediohydrazide, isophthalic acid dihydrazide, propionic acid hydrazide, salicylic acid hydrazide, 3-hydroxy-2-naphthoic acid hydrazide, or benzophenone hydrazine. As indicated above, the hydrazine derivative can be a hydrazine skeleton derivative such as alkyl hydrazine. From the perspective of contributing to the reduction of copper oxide, particularly cuprous oxide, during firing and creating a copper film with a lower resistance, the reducing agent is most preferably hydrazine or hydrazine hydrate. By using hydrazine or hydrazine hydrate, the storage stability of copper oxide improves, and reduction is promoted such that resistance of the conductive film is decreased.

Using hydrazine hydrate in the starting materials as a reducing agent and detecting hydrazine in the copper oxide ink as a resulting material is acceptable. Thus, the forms of hydrazine in the starting material and in the resulting material of copper oxide ink or in the coating film which uses the copper oxide ink can be different. The same applies if reducing agents other than hydrazine are used.

The required amount of reducing agent is proportional to the amount of copper oxide, and is adjusted out of consideration for the demanded reducibility. The mass ratio (mass of reducing agent/mass of copper oxide) of the reducing agent contained in the copper oxide ink of the present embodiment is preferably not less than 0.00010 and not more than 0.10, more preferably not less than 0.0010 and not more than 0.050, even more preferably not less than 0.0010 and not more than 0.030, even more preferably not less than 0.0020 and not more than 0.030, or most preferably not less than 0.0040 and not more than 0.030. If the mass ratio of reducing agent is not less than 0.00010, storage stability improves, and reduction progresses such that the resistance of the copper film decreases. Furthermore, in the present embodiment, by setting the content of the reducing agent according to formula (1) above, the storage stability can be improved even further. If the amount is not more than 0.10, the long-term stability of the copper oxide ink improves.

In the present embodiment, copper oxide ink comprises a reducing agent such as hydrazine. In the present embodiment, by adjusting time and temperature conditions, as described later, and using an inert atmosphere such as a nitrogen atmosphere, it is possible to include a reducing agent in the copper oxide ink in the range of formula (1) above.

[Other Components]

The copper oxide ink of the present embodiment can comprise a dispersion medium (solvent) in addition to the above components.

The dispersion medium used in the present embodiment is, from the perspective of forming the dispersion, selected from among substances that can dissolve the dispersant. However, from the perspective of forming a conductive pattern using a copper oxide ink, the volatility of the dispersion medium exerts an effect on the workability, so the dispersion medium must be suitable for methods of forming the conductive pattern, such as printing or painting. Therefore, the dispersion medium can be selected from the following solvents out of consideration for both dispersiveness and workability in printing or painting.

Specific examples of the dispersion medium include the following solvents. Examples include water, propylene glycol monomethyl ether acetate, 3-methoxy-3-methyl-butyl acetate, ethoxyethyl propionate, propylene glycol monomethyl ether, propylene glycol monoethyl ether, propylene glycol monopropyl ether, propylene glycol tertiary butyl ether, dipropylene glycol monomethyl ether, ethylene glycol butyl ether, ethylene glycol ethyl ether, ethylene glycol methyl ether, ethylene glycol, 1,2-propylene glycol, 1,3-butylene glycol, 2-pentanediol, 2-methylpentane-2,4-diol, 2,5-hexanediol, 2,4-heptanediol, 2-ethylhexane-1,3-diol, diethylene glycol, hexanediol, octanediol, triethylene glycol, tri-1,2-propylene glycol, glycerol, ethylene glycol monohexyl ether, diethylene glycol monoethyl ether, diethylene glycol monobutyl ether, ethylene glycol monobutyl acetate, diethylene glycol monoethyl ether acetate, methanol, ethanol, n-propanol, i-propanol, n-butanol, i-butanol, 2-butanol, t-butanol, n-pentanol, i-pentanol, 2-methylbutanol, 2-pentanol, t-pentanol, 3-methoxybutanol, n-hexanol, 2-methylpentanol, 1-hexanol, 2-hexanol, 2-ethyl butanol, 1-heptanol, 2-heptanol, 3-heptanol, n-octanol, 2-ethylhexanol, 2-octanol, n-nonyl alcohol, 2,6-dimethyl-4-heptanol, n-decanol, cyclohexanol, methylcyclohexanol, 3,3,5-trimethylcyclohexanol, benzyl alcohol, and diacetone alcohol. In addition to the solvents described above, alcohol, glycol, glycol ether, and glycol ester solvents can be used as the dispersion medium. The solvents can be used individually or in combination of two or more thereof, and should be selected in consideration of vaporization and solvent resistance of the printing equipment and printed circuit board in accordance with the printing method.

The dispersion medium is preferably water or a mono-alcohol having 10 or fewer carbon atoms, or more preferably having 7 or fewer carbon atoms. In particular, out of mono-alcohols having 7 or fewer carbon atoms, ethanol, n-propanol, i-propanol, n-butanol, i-butanol, sec-butanol, and t-butanol are preferable because they each have a suitable dispersiveness, volatility, and viscosity. These mono-alcohols can be used individually or in combination of two or more. A mono-alcohol having 7 or fewer carbon atoms is preferable because it restricts the decrease of copper oxide dispersiveness and interacts with the dispersant to enable a more stable dispersion. Additionally, selecting a solvent having 7 or fewer carbon atoms is preferable because resistance is lower.

However, the boiling point exerts an influence on the workability of copper oxide ink. If the boiling point is low, volatility is high, and so workability worsening in that defects due to extraction of solid matter increase and cleaning frequency increases. Therefore, the boiling point for painting or dispenser methods is preferably not less than 40° C., and the boiling point for inkjet method, screen methods, and offset methods is preferably not less than 120° C., more preferably not less than 150° C., or even more preferably not less than 200° C. The upper limit of the boiling point is preferably not more than 300° C. from the perspective of drying.

The content of the dispersion medium in the entirety of the copper oxide ink is preferably not less than 30 mass % and not more than 95 mass %, more preferably not less than 40 mass % and not more than 95 mass %, even more preferably not less than 50 mass % and not more than 90 mass %, or most preferably not less than 50 mass % and not more than 70 mass %.

[Method for Preparing the Reducing Agent]

In the present embodiment, as described in <Summary of the copper oxide ink of the present embodiment> above, it is characteristic for the reducing agent such as hydrazine to be included in a predetermined amount in the copper oxide ink. Thus, the following methods can be presented as methods of preparation for including a predetermined amount of reducing agent in the copper oxide ink.

(A) In the first method, a reducing agent is added to copper oxide. It is a method of adding a reducing agent to a mixture (dispersion) of a copper oxide, a dispersant, and, if necessary, a dispersion medium. The reducing agent can be added simultaneously with any component, or can be added in order along with each component. It is often the case that the copper oxide used is reduced from copper acetate, so it is preferably to quantitatively measure the reducing agent in the copper oxide before adding the reducing agent. For example, in the case when concentration and dilution according to the UF film module are repeated between FIG. 3 (section d) and FIG. 3 (section e) below to replace the solvent and to obtain a dispersion containing copper oxide microparticles, the content of the reducing agent can be adjusted by adding the reducing agent to the dispersion.

(B) Next, the second method will be described. The second method retains the reducing agent added for reduction of the copper acetate in the case that copper oxide is generated from copper acetate, such as above, for continued use in the ink. Control via the reaction temperature and reaction time is preferable. Normally, when copper oxide is generated from copper acetate, the reducing agent is consumed, depending on reaction temperature and reaction time. Furthermore, if the reducing agent remains, it is actively removed by the repeated concentrations and dilutions. In the present method, the reaction temperature and reaction time are properly selected to control the content of reducing agent, concentration and dilution using a solvent are not carried out, and unreacted reducing agent is used as-is in the ink. Additionally, of the reducing agents, hydrazine is extremely unstable, so it is preferable to perform the reduction of copper acetate to copper in an inert atmosphere such as nitrogen, and to perform mixing in a nitrogen atmosphere as well. The procedure is described in detail below.

In the present embodiment, a reducing agent such as hydrazine is used as a reaction starting material, and the reducing agent remains even after the reaction. One example is adding and mixing a reducing agent such as hydrazine in a solution in which copper acetate is dissolved over the course of a first time period in an atmosphere of nitrogen, and mixing in an atmosphere of nitrogen for a second time period to obtain cuprous oxide. It is preferably to adjust the predetermined temperature during each of the first time period and second time period. Thereafter, the supernatant and the precipitate which contains cuprous oxide are separated by a centrifuge, and a dispersant and the like are added to the obtained precipitate, which is dispersed using a homogenizer in an atmosphere of nitrogen to obtain copper oxide ink.

The above first time period for adding the reducing agent is preferably about 5.0 to 60 minutes. The temperature for the first time period is preferably −10° C. to 10° C. The second time period for mixing is preferably about 30 to 120 minutes. The predetermined temperature for the mixing is preferably 10° C. to 40° C. For example, the temperature can be changed in the middle of mixing using an external thermostat or the like.

The method for dispersion treatment is performed preferably by homogenizer, but is not limited to treatment by a homogenizer, and can be performed by, for example, ultrasonic, a ball mill, a bead mill, or a mixer.

In the present embodiment, mixing and dispersing the dispersion liquid containing the copper oxide, dispersant, and reducing agent using a homogenizer or known method is performed in an inert atmosphere such as a nitrogen atmosphere.

In the present embodiment, the inert atmosphere is preferably a nitrogen atmosphere, but other than a nitrogen atmosphere, it can be an argon atmosphere or a helium atmosphere. A plurality of these inert gases can be used in combination for the atmosphere where mixing and dispersion occur.

In the present embodiment, the reducing agent such as hydrazine can be added when, for example, as described above, the dispersant is added to the obtained precipitate, or after the copper oxide ink is obtained. This enables the content of reducing agent to be precisely controlled. Here, the cuprous oxide contained in the copper oxide ink can be the above precipitate or can be a commercially available product.

Thus, a reducing agent such as hydrazine of formula (1) described above can be included.

In the present embodiment, the reducing agent can be hydrazine, a hydrazine derivative or hydrazine hydrate. Additionally, these hydrazines can comprise a different reducing agent. When using a reducing agent other than hydrazine, a hydrazine derivative or hydrazine hydrate, the reducing agent can be included by preparation in accordance with the preparation method of the reducing agent described above to have a content of formula (1).

In the present embodiment, the reducing agent can be quantitatively measured by the surrogate method. Conventionally, the reducing agent such as hydrazine was reacted with benzaldehyde, and after derivatization, was measured by gas chromatography. However, in this quantitative measurement method, when copper oxide nanoparticles which interfere with the quantitative measurement of reducing agent are present, quantitative measurement of reducing agent was difficult. Additionally, during the quantitative measurement operation, the reducing agent such as hydrazine can be decomposed by oxygen in the atmosphere, such that quantitative measurement of reducing agent was difficult. Then, the present inventors ionized the copper oxide using acid in a pretreatment for quantitative measurement, thereby resolving one hindering factor. Furthermore, by using the surrogate method where the variation due to decomposition of the reducing agent such as hydrazine during quantitative measurement is corrected using a surrogate substance, the quantitative measurement of a reducing agent for which quantitative measurement was difficult became possible.

[Preparation of the Dispersion (Copper Oxide Ink) Comprising Copper Oxide and Copper]

A dispersion containing cuprous oxide and copper particles, i.e., a copper oxide ink, can be prepared by mixing copper microparticles, and, if necessary, a dispersion medium, in the above copper oxide dispersion in each of the predetermined ratios, and then performing dispersion treatment using a mixer method, ultrasonic method, 3-roll method, 2-roll method, attritor, homogenizer, Banbury mixer, paint shaker, kneader, ball mill, sand mill, or auto revolving mixer.

Since a part of the dispersion medium is included in the resulting copper oxide dispersion, there is no need to add a dispersion medium at this stage if the amount contained in the copper oxide dispersion is sufficient, or a dispersion medium can be added at this stage as necessary for lowering the viscosity. A dispersion medium can be added after this stage as well. The dispersion medium can be the same as or different from the dispersion medium added during creation of the copper oxide dispersion.

Additionally, as necessary, an organic binder, an antioxidant, a reducing agent, metal particles, or a metal oxide can be added, and as impurities, a metal or a metal oxide, a metal salt or a metal complex can be contained.

Additionally, wire-like, dendritic, and scaly copper particles are very effective at preventing cracks, so these particles can be used individually or in combination of two or more with spherical, cube-shaped, or polyhedral copper particles or other metals, and the surface thereof can be covered in an oxide or another metal with good conductivity, such as silver.

In the case that metal particles other than copper in one or more forms of wire-like, dendritic, or scaly are added, there is a crack-preventing effect similar to that of copper particles having a similar shape, such that it is possible to use them as a replacement for a portion of the copper particles with a similar form, or in addition to copper particles with a similar form, but consideration of migration, particle strength, resistance value, copper leaching, the formation of intermetallic compounds, and cost is necessary. The metal particles other than copper can be, for example, gold, silver, tin, zinc, nickel, platinum, bismuth, indium, or antimony.

As the metal oxide particles, silver oxide, cupric oxide or the like can replace cuprous oxide, or be added to cuprous oxide for use. However, similarly to the case of metal particles, consideration of migration, particle strength, resistance value, copper leaching, formation of intermetallic compounds, and cost is necessary. Addition of these metal particles and metal oxide particles can be employed for adjusting the sintering of a conductive film, the resistivity, the strength of a conductor, and the absorbance at the time of light firing. Even if these metal particles and metal oxide particles are added, cracking is sufficiently restricted by the presence of wire-like, dendritic, and scaly copper particles. These metal particles and metal oxide particles can be used individually or in combination of two or more thereof, and the form thereof is not limited. For example, silver and silver oxide are expected to have the effects of decreasing resistance and decreasing firing temperature.

However, from the perspective of the increased cost of silver, which is a noble metal, and crack prevention, the amount of silver added is preferably within the range that does not exceed the amount of wire-like, dendritic, and scaly copper particles. Tin is inexpensive and has a low melting point, so sintering is easy. However, tin tends to increase resistance, and from the perspective of crack prevention, the amount of tin added is preferably within the range that does not exceed the amount of wire-like, dendritic, and scaly copper particles and cuprous oxide. Cupric oxide can function as a light absorber or heat ray absorber in the methods using light or infrared light, such as flashlamp or laser methods. However, cupric oxide is reduced less easily than cuprous oxide, and from the perspective of preventing separation from the substrate due to the large amount of gas generated during reduction, the amount of cupric oxide added is preferably less than cuprous oxide.

In the present embodiment, even if metals other than copper, copper particles other than wire-like, dendritic, or scaly particles, or metal oxides other than copper oxide are included, crack prevention and improvement in chronological stability of resistance are demonstrated. However, the amount of metals other than copper, copper particles other than wire-like, dendritic, or scaly particles, and metal oxides other than copper oxide added is preferably less than the amount of wire-like, dendritic, scaly copper particles and copper oxide. Additionally, the ratio of added metals other than copper, copper particles other than wire-like, dendritic or scaly particles, and metal oxides other than copper oxide to copper oxide and wire-like, dendritic, and scaly copper particles is preferably not more than 50%, more preferably not more than 30%, or most preferably not more than 10%.

Summary of the Product Containing a Coating Film of the Present Embodiment

The present inventors arrived at the development of a product comprising a coating film which used the copper oxide ink above. Essentially, the components of the copper oxide ink are contained as components of the coating film. Therefore, the coating film comprises the following configuration.

(E) The coating film comprises a copper oxide, a dispersant, and reducing agent such as hydrazine.
(F) The mass ratio (mass of reducing agent/mass of copper oxide) of the reducing agent is not less than 0.00010 and not more than 0.10.
(G) The mass ratio (mass of dispersant/mass of copper oxide) of the dispersant is not less than 0.0050 and not more than 0.30.

As shown in (E) above, the coating film contains a reducing agent such as hydrazine, which contributes to the reduction of copper oxide during firing, such that a copper film with lower resistance can be created.

The mass ratio (mass of reducing agent/mass of copper oxide) of the reducing agent described in (F) above is preferably not less than 0.0010 and not more than 0.050, more preferably not less than 0.0010 and not more than 0.030, even more preferably not less than 0.0020 and not less than 0.030, or most preferably not less than 0.0040 and not more than 0.030. If the mass ratio of the reducing agent is not less than 0.00010, storage stability improves, and reduction proceeds, such that the resistance of the conductive film obtained upon firing the coating film is reduced. Additionally, if the mass ratio is not more than 0.10, the stability of resistance as a conductive film improves.

The mass ratio (mass of dispersant/mass of copper oxide) of the dispersant described in (G) is preferably not less than 0.050 and not more than 0.30, more preferably not less than 0.10 and not more than 0.30, even more preferably not less than 0.20 and not more than 0.30, or most preferably not less than 0.20 and not more than 0.25. The amount of dispersant affects dispersion stability, such that if the amount of dispersant is low, agglomeration occurs more easily, and if the amount of dispersant is high, dispersion stability improves. In the present embodiment, by setting the amount of dispersant to the range in (G), the dispersiveness of the copper oxide in the coating film can be improved. If the content of dispersant in the coating film of the present embodiment is not more than 35 mass %, the influence of residues deriving from dispersant in the conductive layer obtained from firing can be limited, and conductivity can be improved.

The acid value (mgKOH/g) of dispersant is preferably not less than 20 and not more than 130, more preferably not less than 25 and not more than 120, even more preferably not less than 36 and not more than 110, or most preferably not less than 36 and not more than 101. This range is preferable because the dispersion stability is excellent. In particular, this range is effective for copper oxide with a small average particle size. The dispersant can be, for example DISPERBYK-102 (acid value 101), DISPERBYK-140 (acid value 73), DISPERBYK-142, (acid value 46), DISPERBYK-145 (acid value 76), DISPERBYK-118 (acid value 36), or DISPERBYK-180 (acid value 94) by BYK.

The average particle size of the microparticles comprising cuprous oxide in the coating film is preferably not less than 3.0 nm and not more than 50 nm, more preferably not less than 5.0 nm and not more than 40 nm, or most preferably not less than 10 nm, and not more than 29 nm. If the average particle size is not more than 50 nm, intricate patterns can be formed on the substrate more easily, which is preferable. If the average particle size is not less than 3.0 nm, the stability of the resistance as a coating film improves.

Next the reducing agent in the coating film will be described. The reducing agent can be hydrazine, hydrazine hydrate, a hydrazine derivative, sodium, carbon, potassium iodide, oxalic acid, iron(II) sulfide, sodium thiosulfate, ascorbic acid, tin(II) chloride, diisobutylaluminum hydride, formic acid, sodium borohydride, or sulfite. The hydrazine derivative can be a hydrazine salt, alkyl hydrazine, pyrazole, triazole, or hydrazide. The hydrazine salt can be a monohydrochloric acid hydrazine, dihydrochloric acid hydrazine, monohydrobromic acid hydrazine, or carbonic acid hydrazine. The pyrazole can be 3,5-dimethylpyrazole, 3-methyl-5-pyrazolone and the like. Examples of triazoles include 4-amino-1,2,4-triazole, 1,2,4-triazole, 1,2,3-triazole, 1-hydroxybenzotriazole, or 3-mercapto-1,2,4-triazole. The hydrazide can be adipic acid dihydrazide, sebacic acid dihydrazide, dodecanediohydrazide, isophthalic acid dihydrazide, propionic acid hydrazide, salicylic acid hydrazide, 3-hydroxy-2-naphthoic acid hydrazide, or benzophenone hydrazine. As above, the hydrazine derivative can be a hydrazine skeletal derivative such as alkyl hydrazine. From the perspective of contributing to the reduction of copper oxide, particularly cuprous oxide, during firing, and creating a copper film with a lower resistance, the reducing agent is most preferably hydrazine or hydrazine hydrate. By using hydrazine or hydrazine hydrate, the storage stability of copper oxide ink is maintained, reduction progresses, and ultimately the resistance of the conductive film can be decreased.

The coating film of the present embodiment can be manufactured into various materials and processed products such as film substrates, glass substrates, or molded products. Another resin layer may be stacked on this coating film.

It is preferable that a product comprising the coating film of the present embodiment has the following configuration.
- (H): Cuprous oxide, a dispersant, and a reducing agent are contained.
- (I): The acid value of the dispersant is not less than 20 and not more than 130, the dispersant is a phosphorus-containing organic matter, and the content of the dispersant is in the range of formula (1) below.
- (J): The reducing agent comprises at least one selected from hydrazine and hydrazine hydrate, and the content of the reducing agent is in the range of formula (2) below.

$$0.00010 \le (\text{mass of reducing agent/mass of copper oxide}) \le 0.10 \quad (1)$$

$$0.0050 \le (\text{mass of dispersant/mass of copper oxide}) \le 0.30 \quad (2)$$

By limiting the range of the masses of the reducing agent and the dispersant relative to cuprous oxide by the above configuration, the resistance of the conductive layer at the time of firing the coating film can be decreased.

A product comprising the coating film of the present embodiment preferably comprises cuprous copper, a dispersant, a reducing agent, and a dispersion medium.

In this case, the dispersion medium preferably has the configuration below.
- (K) The dispersion medium is a mono-alcohol having 7 or fewer carbon atoms, and the content of dispersion medium in the copper oxide ink is not less than 30 mass %, and not more than 95 mass %.

This configuration enables low temperature firing of the coating film. Additionally, since the firing treatment can be performed using plasma, light, or laser light, the organic matter in the copper oxide decomposes, and firing of the copper oxide progresses, whereby a conductive layer with low resistance can be formed, and dispersion stability is improved.

Summary of the Conductive Substrate of the Present Embodiment

The present inventors developed a conductive substrate with excellent conductivity using the above copper oxide ink. Essentially, by performing firing treatment on a pattern or coating film formed using the copper oxide ink of the present embodiment, a conductive substrate can be obtained.
[Configuration of the Conductive Substrate]

According to the method of firing, two types of conductive substrates can be obtained when using the copper oxide ink of the present embodiment. By forming a coating film on a substrate using the above copper oxide ink, and firing the copper oxide particles of the copper oxide ink with laser irradiation, the conductive substrate of FIG. 2A can be obtained. By printing a desired pattern on a substrate using the copper oxide ink, and firing with plasma, the conductive substrate of FIG. 2B can be obtained.

Figure 2A:
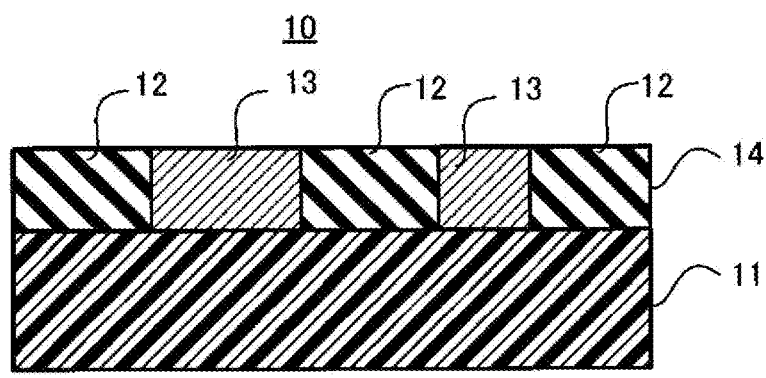
FIG. 2A, FIG. 2B, FIG. 2C, and FIG. 2D are schematic diagrams indicating the conductive substrate of the present embodiment.

As shown in FIG. 2A, the conductive substrate 10 can comprise a substrate 11, and a layer 14 in which, in a sectional view, an insulation region 12 comprising copper oxide and phosphorus-containing organic matter and a conductive region 13 comprising reduced copper of copper oxide reduced by firing are arranged mutually adjacent on the surface composed by the substrate 11. The conductive pattern region 13 composes a copper circuit. The conductive pattern region 13 contains phosphorus derived from phosphorus-containing organic matter as a dispersant. Since the conductive pattern region 13 is formed by firing the copper oxide ink as a dispersion, organic matter such as the organic binder contained in the copper oxide ink is decomposed during the firing process, and in obtained conductive pattern region 13, the solder wettability increases. Thus, the solder layer described below forms more easily on the surface of the conductive pattern region 13 than on a conductive pattern formed without using the copper oxide ink, and soldering of the electronic components is easy. The insulation region 12 preferably contains copper oxide, phosphorus-containing organic matter as the dispersant, and hydrazine or hydrazine hydrate as the reducing agent.

Figure 2B:
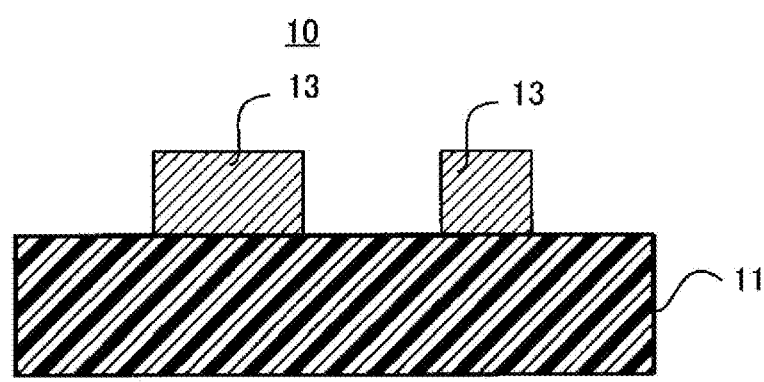

As shown in FIG. 2B, the conductive substrate 10 can comprise a substrate 11, and in a sectional view, a conductive pattern region 13 comprising reduced copper on a surface composed of the substrate 11. The conductive pattern region 13 composes a copper circuit. The conductive pattern region 13 preferably contains phosphorus. Since organic matter such as the organic binder contained in the copper oxide ink is decomposed during the process of firing copper oxide ink, the wettability of solder in the conductive pattern region 13 effectively increases. Thus, the solder layer forms more easily on the surface of the conductive pattern region 13.

The conductive pattern region 13 can partially comprise, for example, cuprous oxide as copper oxide particles not reduced during the firing process. The conductive pattern region 13 can comprise copper particles of copper oxide ink in addition to reduced copper, and can comprise tin. The insulation region 12 and the conductive pattern region 13 can comprise voids. If the conductive pattern region 13 comprises voids, solder can enter into the voids and adhesion between the conductive pattern region 13 and the solder layer improves. Solder is a metal that comprises tin.

Additionally, the layer 14, in which the insulation region 12 and the conductive pattern region 13 are adjacent, can have a gradually changing electrical conductivity and particle condition (fired or not fired) along the surface of the substrate, and a boundary (interface) can exist between the insulation region 12 and the conductive pattern region 13.

Figure 2C:
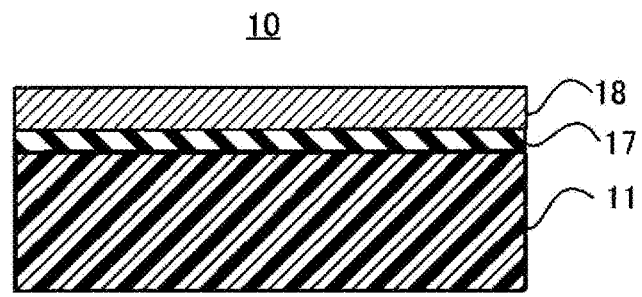

In this case, for example, as shown in FIG. 2C, in the conductive layer 18, cuprous oxide-containing layer 17 comprising copper oxide particles not reduced during the firing process, for example, cuprous oxide, can be formed on the surface of the substrate 11. A conductive layer 18 comprising reduced copper of reduced copper oxide particles is formed on the surface of the cuprous oxide-containing layer 17. Forming the cuprous oxide-containing layer 17 in this way is preferable because adhesion between the substrate 11 and the conductive layer 18 is improved. From the perspective of adhesion between the substrate 11 and the conductive layer 18, the layer thickness of the cuprous oxide-containing layer 17 is preferably not less than 0.0050 m and not more than 8.0 μm, more preferably not less than 0.050 μm and not more than 5.0 μm, even more preferably not less than 0.10 μm and not more than 3.0 μm, or most preferably not less than 0.20 μm and not more than 1.0 μm.

Figure 2D:
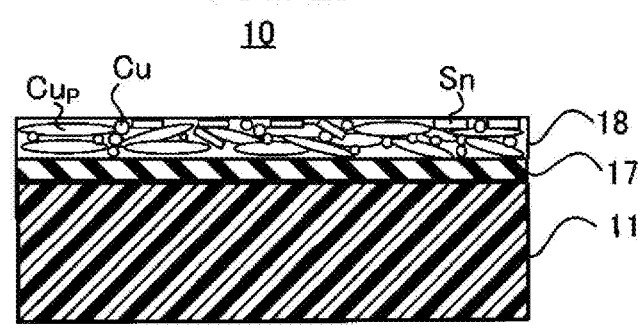

Additionally, as shown in FIG. 2D, the conductive layer 18 can comprise copper particles (Cup) of copper oxide ink along with reduced copper (Cu) of copper oxide particles which were reduced. The conductive layer 18 can comprise voids. By including voids in the conductive layer 18, the tin (Sn) contained in the solder can enter the voids. Due to this, the adhesion between the conductive layer 18 and the solder layer increases. Furthermore, by having reduced copper (Cu) surrounding the copper (Cup), the adhesion between the conductive layer 18 and tin (Sn) increases further. The average particle size of reduced copper (Cu) is preferably 5 to 20 nm.

The grain size of copper contained in the conductive pattern region 13 and conductive layer 18 is preferably not less than 0.10 µm and not more than 100 µm, more preferably not less than 0.50 µm and not more than 50 µm, or most preferably not less than 1.0 µm and not more than 10 µm. Grain size refers to the size of the metal after firing. This increases the adhesion between the solder layer and the conductive pattern region 13 and the conductive layer 18.

Additionally, the surface roughness (calculated average roughness Ra) of the surfaces of the conductive pattern region 13 and the conductive layer 18 is preferably not less than 20 nm and not more than 500 nm, more preferably not less than 50 nm and not more than 300 nm, or most preferably not less than 50 nm and not more than 200 nm. In this range, the solder layer rests easily on the conductive pattern region 13 and the conductive layer 18, and the adhesion between the solder layer and the conductive pattern region 13 and the conductive layer 18 increases. Additionally, when forming a resin layer in which the conductive pattern region 13 and the conductive layer 18 are overlaid, a portion of the resin enters into recesses on the surface of the conductive pattern region 13 and the conductive layer 18, whereby adhesion can be improved.

By forming the conductive pattern region 13 or the conductive layer 18 as in FIG. 2A, FIG. 2B, FIG. 2C, and FIG. 2D, the circuit can be drawn to a line width of not less than 0.10 µm and not more than 1.0 cm, which can be used as a copper circuit or an antenna. Taking advantage of the characteristics of the nanoparticles which are the copper oxide particles contained in the copper oxide ink above, the line width of the conductive pattern region 13 or the conductive layer 18 is preferably not less than 0.50 µm and not more than 10,000 µm, more preferably not less than 1.0 µm and not more than 1,000 µm, even more preferably not less than 1.0 µm and not more than 500 µm, even more preferably not less than 1.0 µm and not more than 100 µm, or most preferably not less than 1.0 µm and not more than 5.0 m. If the line width is not more than 5.0 am, the conductive pattern region 13 and the conductive layer 18 become impossible to visually distinguish, which is preferable from the perspective of design.

The conductive pattern can be formed as a mesh. A mesh is a collection of lines in a lattice shape, whereby permittivity is high and the conductive pattern becomes transparent, which is preferable.

The substrate used in the present embodiment has a surface on which a coating film of copper oxide ink is formed, and can have a sheet shape or can be a three-dimensional object. In the present embodiment, a conductive pattern can be formed on a surface containing curved surfaces or steps composed of three-dimensional bodies. The substrate of the present embodiment refers to a substrate material of a circuit board for forming circuit patterns or a housing material for a housing with circuits printed thereon.

An optically-transparent resin layer (not illustrated) can be provided so as to cover the layer 14 or the conductive pattern region 13. The resin layer prevents the coating layer from contacting oxygen during light irradiation and promotes the reduction of copper oxide in the method for manufacturing a conductive substrate 10 described below. This obviates the need for facilities for vacuum atmospheres or inert gas atmospheres which make the area around the coating film an oxygen-less or low-oxygen atmosphere during light irradiation, such that the manufacturing cost is reduced. The resin layer can prevent the conductive pattern region 13 from stripping or scattering due to heat from the light irradiation. This enables manufacture of a conductive substrate 10 with a good yield.

The conductive substrate formed as illustrated in FIG. 2C and FIG. 2D can be made into a product with a conductive pattern. The product with a conductive pattern comprises a substrate, a cuprous oxide-containing layer formed on a surface of the substrate, and a conductive layer formed on a surface of the cuprous oxide-containing layer, wherein the conductive layer has a circuit with a line width of not less than 1.0 µm and not more than 1000 µm, and the circuit contains reduced copper. The cuprous oxide-containing layer is a layer having a Cu/O ratio of copper to oxygen of not less than 0.5 and not more than 3.0. By analyzing a cross-section of the product with a conductive pattern by the EDX method, Cu/O in the cuprous oxide-containing layer can be quantitatively measured.

The product with a conductive pattern comprises a substrate, a cuprous oxide-containing layer formed on a surface of the substrate, and a conductive layer formed on a surface of the cuprous oxide-containing layer, wherein the conductive layer has a circuit with a line width of not less than 1.0 µm and not more than 1000 µm, and the circuit contains reduced copper (including copper depending on the case) and tin.

The product with a conductive pattern comprises a substrate, and a conductive pattern formed on a surface of the substrate, wherein the conductive layer has a circuit with a line width of not less than 1.0 µm and not more than 1000 µm, and the circuit contains reduced copper, phosphorus, and voids. This configuration enables the formation of circuits with a good shape on a substrate of a desired shape, as will be described below.

The product with a conductive pattern comprises a substrate, a conductive pattern formed on a surface of the substrate, wherein the conductive layer has a circuit with a line width of not less than 1.0 µm and not more than 1000 µm, and the circuit contains reduced copper, copper, and tin.

In the product with a conductive pattern, it is preferable if the circuit can be used as an antenna. An antenna with a good shape can be formed according to this configuration.

In the product with a conductive pattern, a solder layer is preferably formed on a part of the surface of the conductive layer or the conductive pattern. The conductive pattern is formed by firing of the copper oxide of the above dispersion, such that organic matter such as the organic binder decomposes during the firing step. Therefore, the wettability of the solder on the conductive pattern increases, and a solder layer can be easily formed, such that soldering electronic components to the conductive pattern is relatively easy compared to a conductive pattern formed without the above dispersion.

Additionally, the product with a conductive pattern comprises a substrate and a conductive pattern formed on the surface of the substrate, wherein the conductive pattern is a circuit with a line width of not less than 1.0 µm to not more than 1000 µm, and comprises reduced copper, copper oxide, and phosphorus, and a resin is provided so as to cover the circuits.

[Method for Applying the Copper Oxide Ink to a Substrate]

The method of application using the copper oxide ink will be explained. The method of application is not necessarily limited, and printing methods such as screen printing, intaglio direct printing, intaglio offset printing, flexographic printing, reverse printing method, or offset printing, a dispenser drawing method, or a spray method can be used. The application technique can be a die coat, spin coat, slit coat, bar coat, knife coat, spray coat, or dip coat.

[Substrate]

The substrate used in the present embodiment is not particularly limited but can be composed of inorganic material or organic material.

The inorganic material can be, for example, a glass such as soda lime glass, alkali-free glass, borosilicate glass or quartz glass, or a ceramic material such as alumina.

The organic material can be a polymer material or paper. The polymer material can be a resin film, and can be polyimide (PI), polyethylene terephthalate (PET), polyethersulfone (PES), polyethylene naphthalate (PEN), polyester, polycarbonate (PC), polyvinyl alcohol (PVA), polyvinyl butyral (PVB), polyacetal (POM), polyarylate (PAR), polyamide (PA), polyamideimide (PAI), polyetherimide (PEI), polyphenylene ether (PPE), modified polyphenylene ether (m-PPE), polyphenylene sulfide (PPS), polyether ketone (PEK), polyphthalamide (PPA), polyether nitrile (PEN), polybenzimidazole (PBI), polycarbodiimide, polysiloxane, polymethacrylamide, nitrile rubber, acrylic rubber, polyethylene tetrafluoride, epoxy resin, phenol resin, melamine resin, urea resin, polymethyl methacrylate resin (PMMA), polybutene, polypentene, ethylene-propylene copolymer, ethylene-butene-diene copolymer, polybutadiene, polyisoprene, ethylene-propylene-diene copolymer, butyl rubber, polymethylpentene (PMP), polystyrene (PS), styrene-butadiene copolymer, polyethylene (PE), polyvinyl chloride (PVC), polyvinylidene fluoride (PVDF), polyetheretherketone (PEEK), phenol novolac, benzocyclobutene, polyvinylphenol, polychloropyrene, polyoxymethylene, polysulfone (PSF), polyphenylsulfone resin (PPSU), cycloolefin polymer (COP), acrylonitrile tol-butadiene styrene resin (ABS), acrylonitrile styrene resin (AS), nylon resin (PA6, PA66), polybutylene terephthalate resin (PBT), polyethersulfone resin (PESU), polytetrafluoroethylene resin (PTFE), polychlorotrifluoroethylene (PCTFE), or silicone resin. In particular, PI, PET, and PEN are preferable from the perspective of flexibility and cost. The thickness of the substrate can be 1 µm to 10 mm, and is preferably 25 µm to 250 µm. If the thickness of the substrate is not more than 250 µm, the electronic devices can be made to be lighter, space-conserving, and flexible, which is preferable.

The paper can be western-style paper which uses general pulp as a raw material such as high-quality paper, medium quality paper, coated paper, cardboard paper, or cardboard, or a paper which uses cellulose nanofiber as a raw material. In the case of paper, a paper with a polymer material melted in, or a paper impregnation hardened with a sol-gel material can be used. Additionally, these materials can be pasted together by lamination or the like. For example, paper phenolic base materials, paper epoxy base materials, glass composite base materials, composite base materials such as glass epoxy base materials, Teflon (registered trademark) base materials, alumina base materials, low-temperature and low-humidity co-fired ceramics (LTCC), or silicon wafers can be used. The substrate in the present embodiment refers to a substrate material of a circuit board sheet for forming a circuit pattern, or a housing material for a housing with circuits printed thereon.

[Method of Forming a Conductive Film]

The method for manufacturing a conductive film of the present embodiment comprises reducing copper oxide in the coating film to generate copper, fusing the copper, fusing with copper particles if copper particles have been added to the copper oxide ink, and integrating to form a conductive film (copper film). This step is called firing. Therefore, this method is not particularly limited as long as the method reduces and fuses copper oxide, and integrates with copper particles to form a conductive film. The firing in the method for manufacturing a conductive film of the present embodiment can be, for example, performed in a firing furnace, or performed using plasma, infrared light, a flash lamp, or laser, either individually or in combination. After firing, a solder layer described below can be formed on a portion of the conductive film.

In the present embodiment, a conductive pattern can be formed on the substrate by firing treatment of a coating film. Since, according to the method of the present embodiment, the coating liquid is directly formed in the desired pattern on the substrate, productivity improves in comparison to methods that use conventional photoresist.

Figure 3:
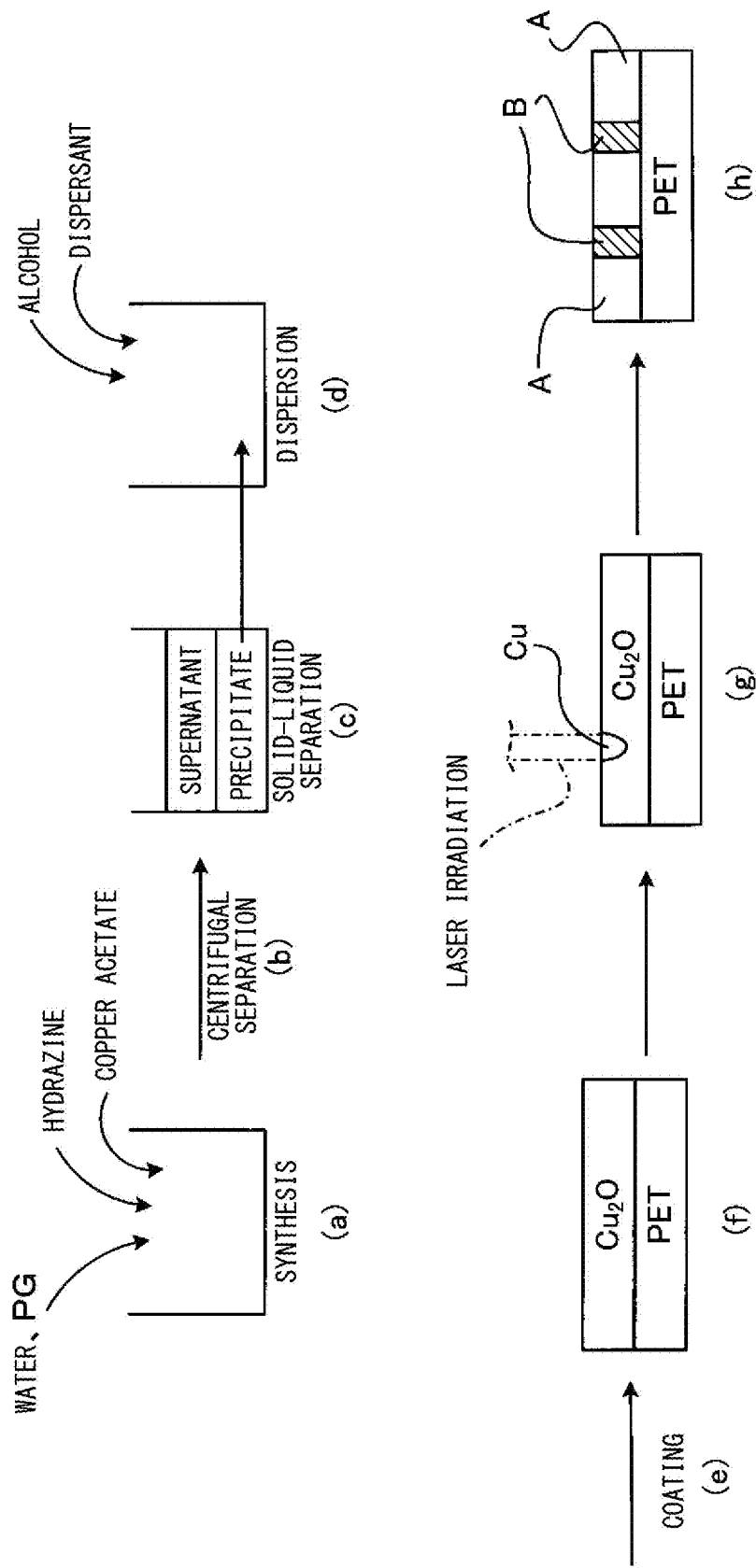
FIG. 3 is an illustration indicating each step of the method for manufacturing a conductive substrate in the case of using laser irradiation for firing in the present embodiment.

The method for manufacturing a conductive substrate using laser irradiation for firing according to the present embodiment will be described in detail with reference to FIG. 3. In FIG. 3 section (a), copper acetate is dissolved in a mixed solvent of water and propylene glycol (PG), hydrazine is added, and the solution is stirred.

Next, in FIG. 3 section (b) and section (c), the solution is separated into supernatant and precipitate by centrifugal separation. Then, in FIG. 3 section (d), dispersant and alcohol are added to the obtained precipitate, and then dispersed. Dispersion is performed under a nitrogen atmosphere using a homogenizer.

In FIG. 3 section (e) and section (f), the copper oxide ink (dispersion) is applied to, for example, a PET substrate (FIG. 3 section (f), indicated as "PET") by a spray coat method, and coating film comprising copper oxide and phosphorus-containing organic matter (FIG. 3 section (f), indicated as "$Cu_2O$") is formed.

Next, in FIG. 3 section (g), laser irradiation, for example, is performed on a coating layer, and a portion of the coating layer is selectively fired, and copper oxide is reduced to copper (FIG. 3 section (g), indicated as "Cu"). As a result, in FIG. 3 section (h), a conductive substrate is formed of a layer in which an insulation region comprising copper oxide and phosphorus-containing organic matter (FIG. 3 section (h), indicated as "A") and a conductive film comprising copper and phosphorus (conductive pattern region)(FIG. 3 section (h), indicated as "B") are provided mutually adjacent is obtained. The conductive pattern region can be used as a circuit.

Additionally, the conductive pattern region can comprise copper oxide particles which were not reduced in the firing process, for example, cuprous oxide. The insulation region and the conductive pattern region can comprise copper particles of copper oxide ink, and can comprise tin. Furthermore, the insulation region and the conductive pattern region can comprise voids. If the conductive pattern region comprises voids, solder can enter into the voids, and the adhesion between the conductive pattern region and the solder layer improves.

Thus, by performing firing by laser irradiation, the firing of the copper particles of the copper oxide ink and the formation of the conductive pattern region can be performed simultaneously. Additionally, by firing the copper particles, organic matter such as organic binder contained in the copper oxide ink is decomposed such that, in the obtained conductive pattern, the wettability of solder increases.

In the present embodiment, the insulation region can have a configuration with a copper oxide, phosphorus-containing organic matter as a dispersant, and hydrazine or hydrazine hydrate as a reducing agent.

Next, the method for manufacturing a conductive substrate in the case that plasma is used for firing according to the present embodiment will be explained with reference to FIG. 4. The steps of FIG. 4 section (a) to section (d) are the same as in FIG. 3.

Figure 4:
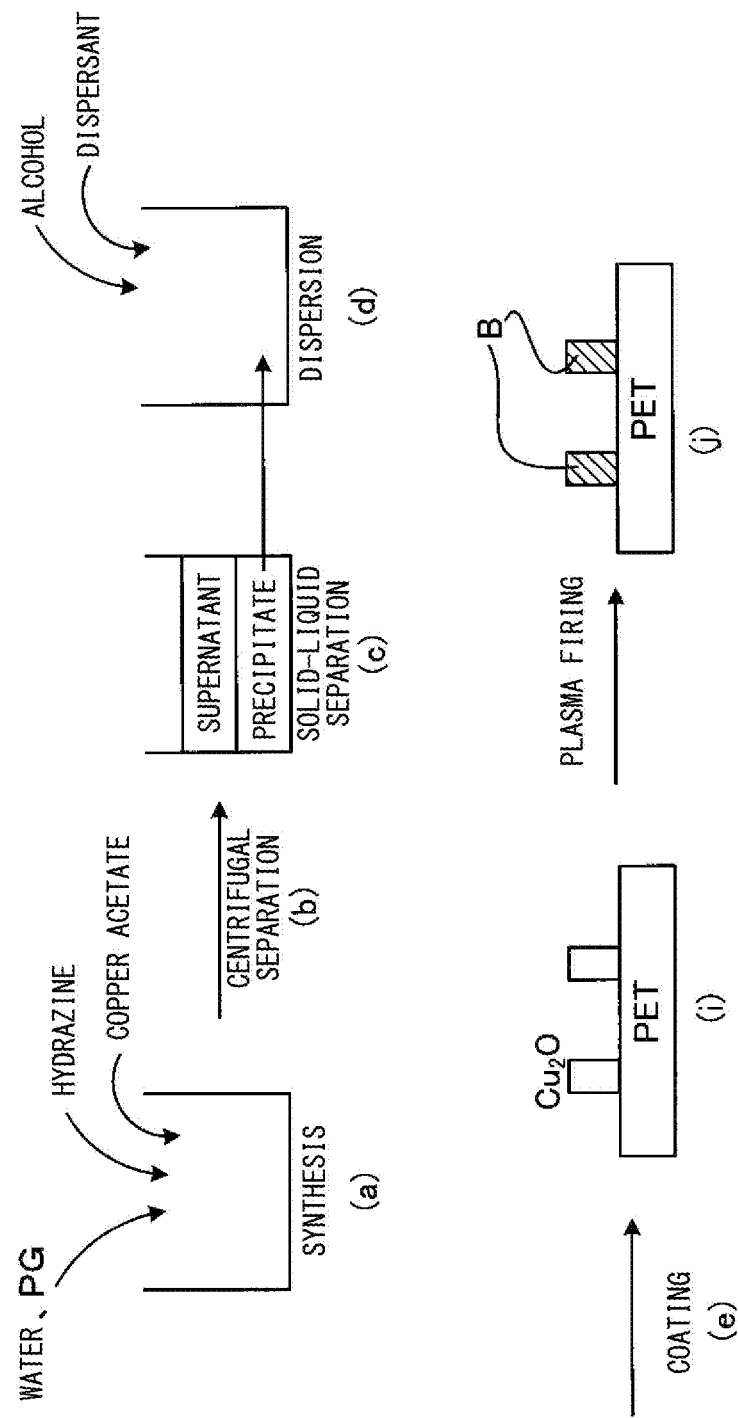
FIG. 4 is an illustration indicating each step of the method for manufacturing a conductive substrate in the case of using plasma for firing in the present embodiment.

In FIG. 4 section (e) and section (i), a copper oxide ink (dispersion) is printed in a desired pattern on, for example, a PET substrate using, for example, inkjet printing to form a coating layer comprising copper oxide and phosphorus-containing organic matter (FIG. 3 section (i), indicated as "$Cu_2O$").

Next, in FIG. 4 section (i), plasma irradiation, for example, is performed on the coating layer, the coating layer is fired and copper oxide is reduced to copper. As a result, in FIG. 4 section (j), a conductive pattern region (FIG. 4 section (j), indicated as "B") comprising copper and phosphorus is formed on the substrate and a conductive substrate is obtained.

Figure 5:
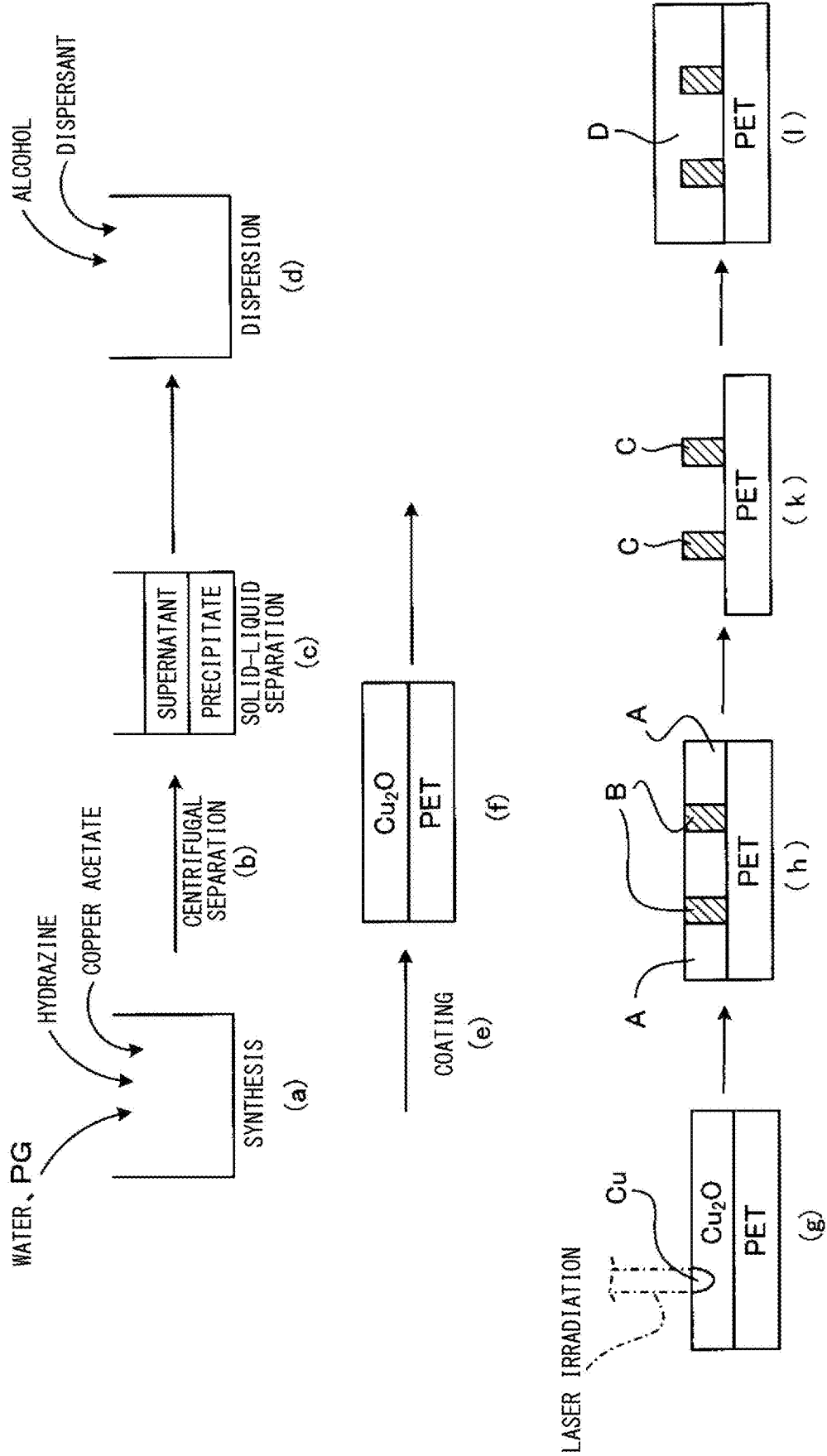
FIG. 5 is an illustration indicating each step of the method for manufacturing a conductive substrate in the case of using laser irradiation for firing in the present embodiment, and comprises steps which differ from FIG. 3.

Similar to FIG. 3, FIG. 5 illustrates a method for manufacturing a conductive substrate in the case that laser irradiation is used for firing. The steps of FIG. 5 section (a) to section (h) are the same as in FIG. 3.

In FIG. 5, the insulation region is further cleaned, thereby enabling the obtainment of a form in which the copper circuit FIG. 5, section (k), indicated as "C") is pattern formed on the support. The copper circuit C is the same layer as the conductive pattern region B. Additionally, a resin layer (FIG. 5 section (l), indicated as "D") can be used to seal over the copper circuit C and the support between the copper circuit C. Resin layer D can be formed to at least cover the copper circuit C as a conductive pattern region B.

The resin layer secures long-term stability. The resin layer is a sealing material layer, and preferably has a sufficiently low moisture permeability. This is because preventing the invasion of moisture from outside the sealing material layer limits oxidation of the copper circuit. The moisture permeability of the sealing material layer is preferably not more than 1.0 g/m$^2$/day, more preferably not more than 0.5 g/m$^2$/day, or most preferably not more than 0.1 g/m$^2$/day. By using a sealing material layer within this range, resistance changes due to oxidation of the copper circuit can be restricted in long-term stability tests at 85° C. and 85% humidity.

For example, the following materials can be used as the material for the sealing material layer. A resin material composed of polypropylene (PP), polyimide (PI), polyethylene terephthalate (PET), polyethersulfone (PES), polyethylene naphthalate (PEN), polyester, polycarbonate (PC), polyvinyl alcohol (PVA), polyvinyl butyral (PVB), polyacetal (POM), polyarylate (PAR), polyamide (PA), polyamideimide (PAI), polyetherimide (PEI), polyphenylene ether (PPE), modified polyphenylene ether (m-PPE), polyphenylene sulfide (PPS), polyether ketone (PEK), polyphthalamide (PPA), polyether nitrile (PENt), polybenzimidazole (PBI), polycarbodiimide, polysiloxane, polymethacrylamide, nitrile rubber, acrylic rubber, polyethylene tetrafluoride, epoxy resin, phenol resin, melamine resin, urea resin, polymethyl methacrylate resin (PMMA), polybutene, polypentene, ethylene-propylene copolymer, ethylene-butene-diene copolymer, polybutadiene, polyisoprene, ethylene-propylene-diene copolymer, butyl rubber, polymethylpentene (PMP), polystyrene (PS), styrene-butadiene copolymer, polyethylene (PE), polyvinyl chloride (PVC), polyvinylidene fluoride (PVDF), polyetheretherketone (PEEK), phenol novolac, benzocyclobutene, polyvinylphenol, polychloropyrene, polyoxymethylene, polysulfone (PSF), polyphenylsulfone resin (PPSU), cycloolefin polymer (COP), acrylonitrile/butadiene/styrene resin (ABS), acrylonitrile/styrene resin (AS), nylon resin (PA6, PA66), polybutyl terephthalate resin (PBT), polyethersulfone resin (PESU), polytetrafluoroethylene resin (PTFE), polychlorotrifluoroethylene (PCTFE), and silicone resin, can be used.

Furthermore, by mixing microparticles consisting of silicon oxide or aluminum oxide with the above materials and providing a layer consisting of silicon oxide or aluminum oxide on the surface of the above materials as a moisture barrier layer, the moisture permeability can be decreased.

During removal of the insulation region, water or an organic solvent like an alcohol such as ethanol, propanol, butanol, isopropyl alcohol, methanol, ethylene glycol, or glycerin, a ketone, an ester, or an ether can be used. In particular, water, ethanol, propanol, butanol, or isopropyl alcohol is preferable in terms of cleaning performance of the insulation region. Additionally, the above solvents can contain a phosphorus-based dispersant. Adding such a dispersant further improves cleaning performance.

The configuration in which the copper circuit is covered in a resin layer can be applied to FIG. 4 as well.

In the method for manufacturing a conductive substrate, copper oxide ink is used to form a pattern on a substrate, on which plasma is generated in an atmosphere that contains reductive gas, and then firing treatment is performed. This configuration enables low temperature firing. Additionally, since the organic matter in the copper oxide effectively decomposes, firing of the copper oxide is promoted, and a conductive substrate having a conductive layer with a lower resistance can be manufactured.

The method for manufacturing a conductive substrate comprises a step of using copper oxide ink to form a coating film on a substrate, and a step of irradiating the coating film with laser light. By performing firing with laser irradiation, the firing of the copper particles of the copper oxide ink and the forming of the conductive pattern can be performed simultaneously. Additionally, since the wavelength of light can be selected, the wavelength of light absorbed by the copper oxide ink and the substrate can be considered. Since the firing time period can be shortened, the damage to the substrate can be restricted and the organic matter in the copper oxide can be effectively decomposed, such that a conductive substrate having a conductive layer with a low resistance can be manufactured.

The method for manufacturing a conductive substrate comprises a step of using copper oxide ink to form a coating film on a substrate, and a step of irradiating the coating film with xenon light. In this configuration, the firing time period can be shortened, such that the damage to the substrate can be restricted and the organic matter in the copper oxide can be effectively decomposed, whereby a conductive substrate having a conductive layer with a low resistance can be manufactured.

(Firing of the Coating Film)

The method of firing treatment is not particularly limited, as long as a conductive layer demonstrating the effects of the present invention can be formed, and specific examples include, a firing furnace method, a plasma firing method, and a light firing method. In the laser irradiation of light firing, a coating film is formed for the copper oxide ink as a dispersant, and by laser irradiating the coating film, firing of the copper particles and patterning can be performed simultaneously. In other firing methods, a desired pattern is printed using copper oxide ink, and then fired to obtain a conductive pattern. When creating a conductive pattern, a portion of the cuprous oxide at the surface contacting the substrate will remain unreduced, which is preferable because it increases the adhesion between the conductive pattern and the substrate.

[Firing Furnace]

In the method of firing by a firing furnace, which is easily affected by oxygen, it is preferable to treat the coating film of the copper oxide ink in a non-oxidizing atmosphere. In cases in which copper oxide is not readily reduced simply by the organic components contained in the copper oxide ink, it is preferable to perform the firing in a reducing atmosphere. A non-oxidizing atmosphere is an atmosphere than does not contain oxidizing gas such as oxygen, and is filled with inert gas such as nitrogen, argon, helium, neon, or the like. A reducing atmosphere refers to an atmosphere in which a reducing gas such as hydrogen or carbon monoxide is present, but the reducing gas can be mixed with inert gas. These gases can be injected into the firing furnace and kept closed, or the gases can be continually flowed through while firing the coating film of the copper oxide ink. Additionally, the firing can be performed as a pressurized atmosphere or a decompressed atmosphere.

[Plasma Firing Method]

The plasma method of the present embodiment enables treatment at lower temperatures than the method that uses a firing furnace, and is one of the better firing methods in the case of a resin film substrate with a low heat resistance. Additionally, plasma enables the removal of oxide films and organic substances on the pattern surface, such that good solderability can be achieved. Specifically, this is a method of flowing a reducing gas or a mixed gas of a reducing gas and an inert gas into a chamber, generating a plasma by microwaves, using the active species generated thereby as the heat source necessary for reduction or sintering and for decomposition of the organic matter contained in the dispersant to obtain a conductive film.

Particularly in the metal portion, deactivation of the active species is common, and the metal portion is selectively heated, and the temperature of the substrate rises less easily, such that this method can be applied to a resin film as a substrate. The copper oxide ink comprises copper as a metal, and heating of only the pattern portion where copper oxide changes as firing progresses is promoted. If organic matter of the dispersant or binder component remains in the conductive pattern, sintering is hindered and resistance increases, but the plasma method is very effective at removing organic matter from the conductive pattern.

The reducing gas component can be hydrogen or the like, and the inert gas component can be nitrogen, helium, argon, or the like. These can be used individually or in a mixture of a reducing gas component and an inert gas component in an arbitrary ratio. Furthermore, two or more gases can be mixed and used as the inert gas component.

In the plasma firing method, the microwave input power, introduction gas flow rate, internal chamber pressure, distance between the plasma generation source and the sample to be treated, temperature of the sample to be treated, and treatment time can be adjusted. By adjusting these parameters, the strength of the treatment can be changed. Therefore, by optimizing the above adjustable parameters, a conductive film with a low resistance can be obtained not only for substrates of inorganic materials, but for substrates using organic materials such as thermosetting resin films, paper, thermoplastic resin films with low heat resistance such as PET or PEN. However, the optimal conditions differ according to the apparatus configuration and type of sample, so the conditions must be adjusted to suit the situation.

[Light Firing Method]

The light firing method of the present embodiment can use a laser light method or a flash light method using a discharge tube of xenon as the light source. These methods provide short exposure to high intensity light, raising the temperature of the copper oxide ink applied to the substrate in a short time for firing, and are methods for performing reduction of copper oxide, sintering of copper particles, integration of the copper particles, and decomposition of organic components to form a conductive film. Since the firing time is extremely short, it is a method with little damage to the substrate, and can be applied to resin film substrates with low heat resistance.

The flash light method uses a xenon discharge tube to instantly discharge a charge accumulated in a capacitor, generating a large amount of pulsed light, irradiating copper oxide ink formed on a substrate to instantly heat the copper oxide to a high temperature, changing the copper oxide to a conductive film. The amount of light exposure can be adjusted by the intensity of light, duration of light emission, light irradiation interval, and number of exposures. If the optical transparency of the substrate is high, a conductive pattern can be formed of a copper oxide ink on resin substrates with a low heat resistance, for example, PET or PEN.

A similar effect can be obtained using a laser light source, even though the source of emitted light is different. In the case of a laser, in addition to the adjustable parameters of the flash light method, the degree of freedom of the wavelength selection can be selected in consideration of the wavelength of light absorbed by the copper oxide ink forming the pattern and the wavelength of light absorbed by the substrate. Additionally, exposure to light by a beam scan is possible, which features easy adjustment of the range of light exposure, such as selecting either exposing the entire surface of the substrate or exposing only a part. The laser can be a YAG (yttrium-aluminum-garnet), a YVO (yttrium-vanadate), a Yb (ytterbium), a semiconductor laser (GaAs, GaAlAs, GaInAs) or a carbon dioxide gas, and can be used to emit higher harmonics in addition to the basic wave, as necessary.

In particular, when laser light is used, the wavelength of emitted light is preferably not less than 300 nm and not more than 1500 nm. For example, the wavelength of emitted light is preferably 355 nm, 405 nm, 445 nm, 450 nm, 532 nm, or 1056 nm. In the case that the substrate or the housing is a resin, the laser wavelength is preferably 355 nm, 405 nm, 445 nm, 450 nm, or 532 nm. The light beams are preferably laser light with a center wavelength not less than 355 nm and not more than 532 nm. By selecting these wavelengths, which are wavelengths absorbed by the coating layer containing cuprous oxide, the reduction of cuprous oxide occurs homogeneously, and a region (conductive pattern region) with a low resistance can be obtained. Additionally, by using a laser, it is possible for form copper circuits on curved surfaces or three-dimensional shapes.

In the present embodiment, by selecting a support that is optically transparent, the light rays transmit through the support, such that a portion of the coating layer can be properly fired.

Additionally, according to the method for manufacturing the structure having the conductive pattern region according to the present embodiment, a portion of the applied layer comprising copper oxide and phosphorus-containing organic matter is fired by a laser to make the conductive pattern region, and the unfired components can be used as the insulation of the conductive pattern region. Therefore, it is not necessary to remove the unfired components of the applied layer. Thus, a manufacturing step is eliminated, and since solvents and the like are not required, cost can be reduced. Additionally, since it is not necessary to provide solder resist due to the insulation of the conductive pattern region, that manufacturing step can be eliminated. However, the insulation layer may be removed.

In the case of removing the insulation region, water or an organic solvent like an alcohol such as ethanol, propanol, butanol, isopropyl alcohol, methanol, ethylene glycol, or glycerin, a ketone, an ester, or an ether can be used. In particular, water, ethanol, propanol, butanol, or isopropyl alcohol is preferable in terms of cleaning performance of the insulation region. Additionally, the above solvents can contain a phosphorus-based dispersant. Adding such a dispersant further improves cleaning performance.

[Forming a Solder Layer on the Conductive Pattern]

In the conductive substrate created using a dispersion of the present embodiment, the dispersant and dispersion medium, which decrease solderability, are decomposed during the step of firing treatment, such that when soldering a body to be connected (for example, an electronic component) to the conductive pattern, there is the merit that the melted solder applies smoothly. Solder is an alloy with lead and tin as main components, and includes even lead-free solder which does not contain lead. The conductive pattern of the present embodiment contains voids, such that when solder enters the voids, adhesion between the conductive pattern and the solder layer increases.

As described above, the grain size of the copper contained in the conductive pattern and the conductive layer is preferably not less than 0.10 μm and not more than 100 μm, more preferably not less than 0.50 μm and not more than 50 μm, or most preferably not less than 1.0 μm and not more than 10 μm. This increases the adhesion between the conductive pattern and the solder layer.

In the present embodiment, electronic component refers to at least one of an active component such as a semiconductor, an integrated circuit, a diode, or a liquid crystal display, a passive component such as a resistor, or a capacitor, and a mechanical component such as a connector, a switch, an electric wire, a heat sink, or an antenna.

Additionally, the formation of the solder layer on the conductive pattern is preferably performed by the reflow method. In the reflow method, first, solder is applied as a solder paste (cream solder) to the surface of a portion of the conductive pattern region formed in FIG. 3 section (h) and FIG. 4 section (j), for example, the land. Application of the solder paste can be performed, for example, by contact printing using a metal mask and a metal squeegee. Thus, a solder layer is formed on a portion of the surface of the conductive pattern. Essentially, after the step in FIG. 3 section (h), a conductive substrate with a solder layer formed on a portion of the conductive pattern in the layer is obtained. Additionally, after the step in FIG. 4 section (j), a conductive substrate with a solder layer formed on a portion of the surface of the conductive pattern is obtained. The area of the portion of the surface of the conductive pattern with a solder layer formed thereon is not particularly limited, as long as the area enables the connection of the conductive pattern to electronic components.

(Joining Electronic Components)

Figure 6A:
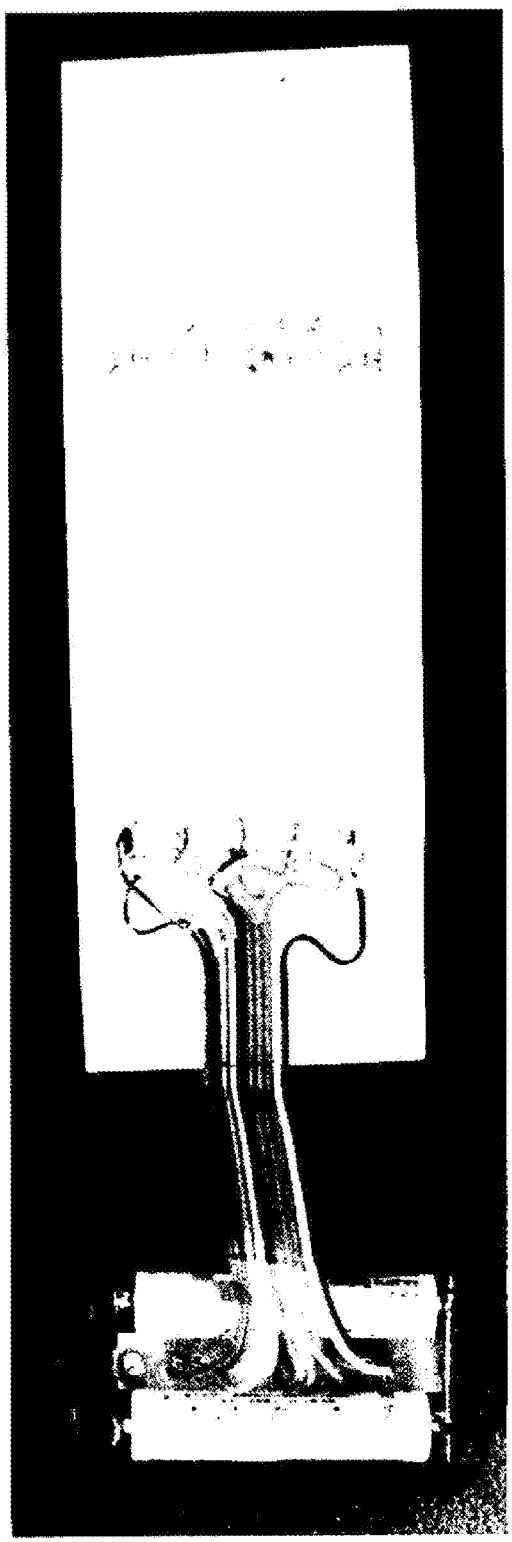
FIG. 6A and FIG. 6B are illustrations indicating each step of the method for manufacturing a conductive substrate in the case of using laser irradiation for firing in the present embodiment, and comprises steps which differ from FIG. 3.
Figure 6B:
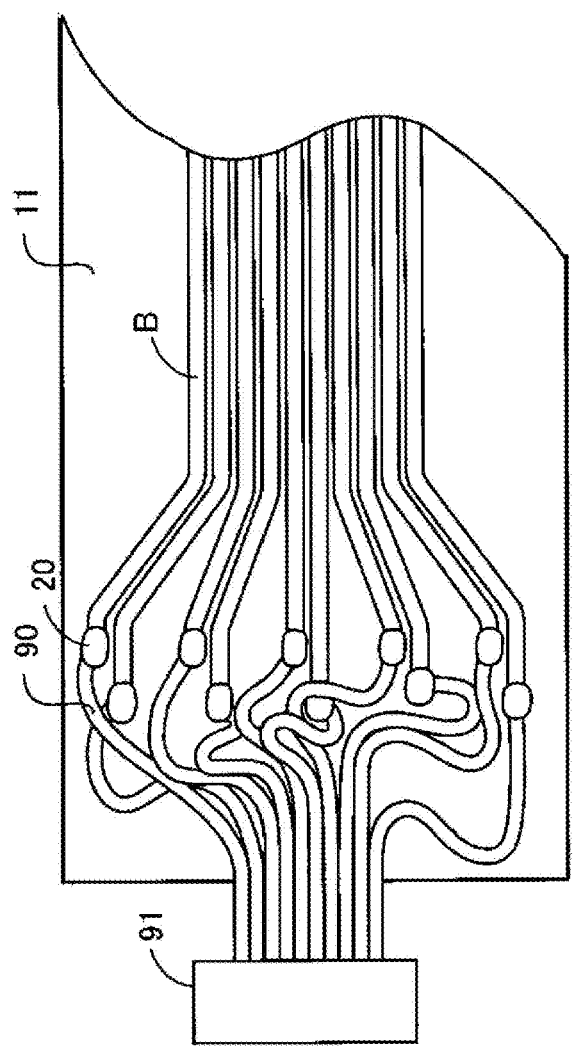

Next, an electronic component is loaded onto the conductive substrate such that the connected portion of the electronic component is made to contact a part of the applied solder paste (solder layer). Thereafter, the conductive substrate with electronic components loaded thereon is heated through a reflow furnace, and a part of the conductive pattern region (land) and the connected portion of the electronic component are soldered together. FIG. 6A and FIG. 6B are overhead diagrams of the conductive substrate with a solder layer formed thereon of the present embodiment. FIG. 6A is a picture of a conductive substrate with a solder layer formed thereon, and FIG. 6B is a pattern diagram thereof.

As shown in FIG. 6A and FIG. 6B, conductive pattern B formed by firing copper oxide ink as a dispersion is formed on substrate 11 having flexibility. A solder layer 20 is formed on the surface of conductive pattern B. Due to solder layer 20, conductive pattern B and conductor 90 are properly soldered together such that conductive pattern B is properly connected to electronic component 91 via the conductor 90.

In the method for manufacturing a conductive substrate according to the present embodiment, the copper oxide ink as a dispersion is fired and a conductive pattern is formed, such that the organic binder contained in the dispersion is decomposed, whereby the obtained conductive pattern has solder with high wettability and a surface on which solder can easily be formed. Thus, it is possible to solder electronic components. As a result, imperfections in the solder layer connecting the conductive pattern region and the connected portion of the electronic component can be prevented, and a conductive substrate with electronic components soldered thereon can be manufactured with a high yield.

EXAMPLES

The present invention will be explained below according to Examples and Comparative Examples, but the present invention is not limited thereto.

[Quantitation Method for Hydrazine]

Hydrazine was quantitatively measured using a surrogate method.

33 μg of hydrazine, 33 μg of a surrogate substance (hydrazine $^{15}N_2H_4$), and 1 ml of benzaldehyde 1% acetonitrile solution were added to a 50 μL sample (copper nanoink). 20 μL of phosphoric acid was added, and 4 hours later, a GC/MS measurement was taken.

Similarly, 66 μg of hydrazine, 33 μg of a surrogate substance (hydrazine $^{15}N_2H_4$), and 1 ml of benzaldehyde 1% acetonitrile solution were added to a 50 μL sample (copper nanoink). 20 μL of phosphoric acid was added, and 4 hours later, a GC/MS measurement was taken.

Similarly, 133 μg of hydrazine, 33 μg of a surrogate substance (hydrazine $^{15}N_2H_4$), and 1 ml of benzaldehyde 1% acetonitrile solution were added to a 50 μL sample (copper nanoink). 20 μL of phosphoric acid was added, and 4 hours later, a GC/MS measurement was taken.

Lastly, without adding hydrazine, 33 μg of a surrogate substance (hydrazine $^{15}N_2H_4$), and 1 ml of benzaldehyde 1% acetonitrile solution were added to a 50 μL sample (copper nanoink). 20 μL of phosphoric acid was added, and 4 hours later, a GC/MS measurement was taken.

The peak area values for hydrazine were obtained from the chromatogram with m/z=207 of the GC/MS measurements of the above 4 samples. Next, the surrogate peak area value was obtained from the chromatogram with m/z=209. With the added hydrazine weights/added surrogate weight on the x-axis, and the hydrazine peak area values/the surrogate substance peak area value on the y-axis, the calibration curve was obtained using the surrogate method.

The value of the y-intercept obtained from the calibration curve was divided by the added hydrazine weight/added surrogate substance weight, and the weight of hydrazine was obtained.

[Particle Size Measurement]

The average particle size of the copper oxide ink was measured according to the cumulant method using an FPAR-1000 by Otsuka Electronics, Corp.

Example 1

806 g of copper(II) acetate monohydrate (Kanto Chemical Co., Ltd.) was dissolved in a mixed solvent of 7560 g of distilled water (Kyoei Pharmaceutical Co., Ltd.) and 3494 g of 1,2-propylene glycol (Kanto Chemical Co., Ltd.), and then the solution temperature was brought to −5° C. using an external thermostat. 235 g of hydrazine monohydrate (Tokyo Chemical Industry Co., Ltd.) was added over 20 minutes (first time period) in a nitrogen atmosphere, and then mixed for 30 minutes (first time period), the solution temperature was brought to 25° C. using an external thermostat, and then mixed for 90 minutes (second time period) in a nitrogen atmosphere. After mixing, the solution was separated into a supernatant and precipitate using centrifugal separation. 54.8 g of DISPERBYK-145 (BYK Co.), 13.7 g of Surflon S611 (Seimi Chemical Co.), and 907 g of ethanol (Kanto Chemical Co., Ltd.) were added to 390 g of the obtained precipitate, and the solution was dispersed in a nitrogen atmosphere using a homogenizer, to obtain 1365 g of a cuprous oxide dispersion liquid (copper oxide ink).

The dispersion liquid dispersed well. The percentage of cuprous oxide contained was 20%, and the particle size was 21 nm. The amount of hydrazine was 3000 ppm.

Example 2

806 g of copper(II) acetate monohydrate (Kanto Chemical Co., Ltd.) was dissolved in a mixed solvent of 7560 g of distilled water (Kyoei Pharmaceutical Co., Ltd.) and 3494 g of 1,2-propylene glycol (Kanto Chemical Co., Ltd.), and then the solution temperature was brought to −5° C. using an external thermostat. 235 g of hydrazine monohydrate (Tokyo Chemical Industry Co., Ltd.) was added over 20 minutes in a nitrogen atmosphere, and then mixed for 30 minutes, the solution temperature was brought to 25° C. using an external thermostat, and then mixed for 90 minutes in a nitrogen atmosphere. After mixing, the solution was separated into a supernatant and precipitate using centrifugal separation. 54.8 g of DISPERBYK-145 (BYK Co.), 13.7 g of Surflon S611 (Seimi Chemical Co.), and 907 g of ethanol (Kanto Chemical Co., Ltd.) were added to 390 g of the obtained precipitate, and the solution was dispersed in a nitrogen atmosphere using a homogenizer, to obtain 1365 g of a cuprous oxide dispersion liquid. The dispersion liquid was bubbled in air for an additional 3 hours, and the amount of dispersion medium lost due to bubbling was replaced with ethanol to obtain the original 1365 g.

The dispersion liquid dispersed well. The percentage of cuprous oxide contained was 20%, and the particle size was 23 nm. The amount of hydrazine was 700 ppm.

Example 3

806 g of copper(II) acetate monohydrate (Kanto Chemical Co., Ltd.) was dissolved in a mixed solvent of 7560 g of distilled water (Kyoei Pharmaceutical Co., Ltd.) and 3494 g of 1,2-propylene glycol (Kanto Chemical Co., Ltd.), and then the solution temperature was brought to −5° C. using an external thermostat. 235 g of hydrazine monohydrate (Tokyo Chemical Industry Co., Ltd.) was added over 20 minutes in a nitrogen atmosphere, and then mixed for 30 minutes, the solution temperature was brought to 25° C. using an external thermostat, and then mixed for 90 minutes in a nitrogen atmosphere. After mixing, the solution was separated into a supernatant and precipitate using centrifugal separation. 68.5 g of DISPERBYK-118 (BYK Co., solid content 890%), 13.7 g of Surflon S611 (Seimi Chemical Co.), and 893 g of ethanol (Kanto Chemical Co., Ltd.) were added to 390 g of the obtained precipitate, and the solution was dispersed in a nitrogen atmosphere using a homogenizer, to obtain 1365 g of a cuprous oxide dispersion liquid.

The dispersion liquid dispersed well. The percentage of cuprous oxide contained was 20%, and the particle size was 23 nm. The amount of hydrazine was 2900 ppm.

Example 4

806 g of copper(II) acetate monohydrate (Kanto Chemical Co., Ltd.) was dissolved in a mixed solvent of 7560 g of distilled water (Kyoei Pharmaceutical Co., Ltd.) and 3494 g of 1,2-propylene glycol (Kanto Chemical Co., Ltd.), and then the solution temperature was brought to −5° C. using an external thermostat. 235 g of hydrazine monohydrate (Tokyo Chemical Industry Co., Ltd.) was added over 20 minutes in a nitrogen atmosphere, and then mixed for 30 minutes, the solution temperature was brought to 25° C. using an external thermostat, and then mixed for 90 minutes in a nitrogen atmosphere. After mixing, the solution was separated into a supernatant and precipitate using centrifugal separation. 54.8 g of DISPERBYK-102 (BYK Co.), 13.7 g of Surflon S611 (Seimi Chemical Co.), and 907 g of ethanol (Kanto Chemical Co., Ltd.) were added to 390 g of the obtained precipitate, and the solution was dispersed in a nitrogen atmosphere using a homogenizer, to obtain 1365 g of a cuprous oxide dispersion liquid.

The dispersion liquid dispersed well. The percentage of cuprous oxide contained was 20%, and the particle size was 16 nm. The amount of hydrazine was 2700 ppm.

Example 5

806 g of copper(II) acetate monohydrate (Kanto Chemical Co., Ltd.) was dissolved in a mixed solvent of 7560 g of distilled water (Kyoei Pharmaceutical Co., Ltd.) and 3494 g of 1,2-propylene glycol (Kanto Chemical Co., Ltd.), and then the solution temperature was brought to −5° C. using an external thermostat. 235 g of hydrazine monohydrate (Tokyo Chemical Industry Co., Ltd.) was added over 20 minutes in a nitrogen atmosphere, and then mixed for 30 minutes, the solution temperature was brought to 25° C. using an external thermostat, and then mixed for 90 minutes in a nitrogen atmosphere. After mixing, the solution was separated into a supernatant and precipitate using centrifugal separation. 1.37 g of DISPERBYK-145 (BYK Co.), 13.7 g of Surflon S611 (Seimi Chemical Co.), and 960 g of ethanol (Kanto Chemical Co., Ltd.) were added to 390 g of the obtained precipitate, and the solution was dispersed in a nitrogen atmosphere using a homogenizer, to obtain 1365 g of a cuprous oxide dispersion liquid.

The dispersion liquid dispersed well. The percentage of cuprous oxide contained was 20%, and the particle size was 24 nm. The amount of hydrazine was 3000 ppm.

Example 6

806 g of copper(II) acetate monohydrate (Kanto Chemical Co., Ltd.) was dissolved in a mixed solvent of 7560 g of distilled water (Kyoei Pharmaceutical Co., Ltd.) and 3494 g of 1,2-propylene glycol (Kanto Chemical Co., Ltd.), and then the solution temperature was brought to −5° C. using an external thermostat. 235 g of hydrazine monohydrate (Tokyo Chemical Industry Co., Ltd.) was added over 20 minutes in a nitrogen atmosphere, and then mixed for 30 minutes, the solution temperature was brought to 25° C. using an external thermostat, and then mixed for 90 minutes in a nitrogen atmosphere. After mixing, the solution was separated into a supernatant and precipitate using centrifugal separation. 82.2 g of DISPERBYK-145 (BYK Co.), 13.7 g of Surflon S611 (Seimi Chemical Co.), and 880 g of ethanol (Kanto Chemical Co., Ltd.) were added to 390 g of the obtained precipitate, and the solution was dispersed in a nitrogen atmosphere using a homogenizer, to obtain 1365 g of a cuprous oxide dispersion liquid (copper oxide ink).

The dispersion liquid dispersed well. The percentage of cuprous oxide contained was 20%, and the particle size was 23 nm. The amount of hydrazine was 3000 ppm.

Example 7

1.5 g of hydrazine (Tokyo Chemical Industry Co., Ltd.) was added to 98.5 g of the dispersion liquid obtained in Example 1 in a nitrogen atmosphere.

The dispersion liquid dispersed well. The percentage of cuprous oxide contained was 20%, and the particle size was 29 nm. The amount of hydrazine was 18000 ppm.

Example 8

806 g of copper(II) acetate monohydrate (Kanto Chemical Co., Ltd.) was dissolved in a mixed solvent of 7560 g of distilled water (Kyoei Pharmaceutical Co., Ltd.) and 3494 g of 1,2-propylene glycol (Kanto Chemical Co., Ltd.), and then the solution temperature was brought to −5° C. using an external thermostat. 235 g of hydrazine monohydrate (Tokyo Chemical Industry Co., Ltd.) was added over 20 minutes in a nitrogen atmosphere, and then mixed for 30 minutes, the solution temperature was brought to 25° C. using an external thermostat, and then mixed for 90 minutes in a nitrogen atmosphere. After mixing, the solution was separated into a supernatant and precipitate using centrifugal separation. 54.8 g of DISPERBYK-145 (BYK Co.), 13.7 g of Surflon S611 (Seimi Chemical Co.), and 907 g of butanol (Kanto Chemical Co., Ltd.) were added to 390 g of the obtained precipitate, and the solution was dispersed in a nitrogen atmosphere using a homogenizer, to obtain 1365 g of a cuprous oxide dispersion liquid.

The dispersion liquid dispersed well. The percentage of cuprous oxide contained was 20%, and the particle size was 20 nm. The amount of hydrazine was 3000 ppm.

Example 9

806 g of copper(II) acetate monohydrate (Kanto Chemical Co., Ltd.) was dissolved in a mixed solvent of 7560 g of distilled water (Kyoei Pharmaceutical Co., Ltd.) and 3494 g of 1,2-propylene glycol (Kanto Chemical Co., Ltd.), and then the solution temperature was brought to −5° C. using an external thermostat. 235 g of hydrazine monohydrate (Tokyo Chemical Industry Co., Ltd.) was added over 20 minutes in a nitrogen atmosphere, and then mixed for 30 minutes, the solution temperature was brought to 25° C. using an external thermostat, and then mixed for 90 minutes in a nitrogen atmosphere. After mixing, the solution was separated into a supernatant and precipitate using centrifugal separation. 54.8 g of DISPERBYK-145 (BYK Co.), 13.7 g of Surflon S611 (Seimi Chemical Co.), and 907 g of propanol (Kanto Chemical Co., Ltd.) were added to 390 g of the obtained precipitate, and the solution was dispersed in a nitrogen atmosphere using a homogenizer, to obtain 1365 g of a cuprous oxide dispersion liquid.

The dispersion liquid dispersed well. The percentage of cuprous oxide contained was 20%, and the particle size was 24 nm. The amount of hydrazine was 3000 ppm.

Example 10

806 g of copper(II) acetate monohydrate (Kanto Chemical Co., Ltd.) was dissolved in a mixed solvent of 7560 g of distilled water (Kyoei Pharmaceutical Co., Ltd.) and 3494 g of 1,2-propylene glycol (Kanto Chemical Co., Ltd.), and then the solution temperature was brought to −5° C. using an external thermostat. 235 g of hydrazine monohydrate (Tokyo Chemical Industry Co., Ltd.) was added over 20 minutes in a nitrogen atmosphere, and then mixed for 30 minutes, the solution temperature was brought to 25° C. using an external thermostat, and then mixed for 90 minutes in a nitrogen atmosphere. After mixing, the solution was separated into a supernatant and precipitate using centrifugal separation. 54.8 g of DISPERBYK-145 (BYK Co.), 13.7 g of Surflon S611 (Seimi Chemical Co.), and 907 g of decanol (Kanto Chemical Co., Ltd.) were added to 390 g of the obtained precipitate, and the solution was dispersed in a nitrogen atmosphere using a homogenizer, to obtain 1365 g of a cuprous oxide dispersion liquid.

Agglomeration of copper particles was seen in a portion in the dispersion liquid. The percentage of cuprous oxide contained was 20%, and the particle size was 47 nm. The amount of hydrazine was 3000 ppm.

Example 11

806 g of copper(II) acetate monohydrate (Kanto Chemical Co., Ltd.) was dissolved in a mixed solvent of 7560 g of distilled water (Kyoei Pharmaceutical Co., Ltd.) and 3494 g of 1,2-propylene glycol (Kanto Chemical Co., Ltd.), and then the solution temperature was brought to −5° C. using an external thermostat. 235 g of hydrazine monohydrate (Tokyo Chemical Industry Co., Ltd.) was added over 20 minutes in a nitrogen atmosphere, and then mixed for 30 minutes, the solution temperature was brought to 25° C. using an external thermostat, and then mixed for 90 minutes in a nitrogen atmosphere. After mixing, the solution was separated into a supernatant and precipitate using centrifugal separation. 54.8 g of DISPERBYK-145 (BYK Co.), 13.7 g of Surflon S611 (Seimi Chemical Co.), and 907 g of octanol (Kanto Chemical Co., Ltd.) were added to 390 g of the obtained precipitate, and the solution was dispersed in a nitrogen atmosphere using a homogenizer, to obtain 1365 g of a cuprous oxide dispersion liquid.

Agglomeration of copper particles was seen in a portion in the dispersion liquid. The percentage of cuprous oxide contained was 20%, and the particle size was 30 nm. The amount of hydrazine was 3000 ppm.

Example 12

0.30 g of hydrazine (Tokyo Chemical Industry Co., Ltd.) was added to 1000 g of the dispersion liquid obtained in Example 2 in a nitrogen atmosphere.

The dispersion liquid dispersed well. The percentage of cuprous oxide contained was 20%, and the particle size was 23 nm. The amount of hydrazine was 1000 ppm.

Example 13

0.80 g of hydrazine (Tokyo Chemical Industry Co., Ltd.) was added to 1000 g of the dispersion liquid obtained in Example 2 in a nitrogen atmosphere.

The dispersion liquid dispersed well. The percentage of cuprous oxide contained was 20%, and the particle size was 23 nm. The amount of hydrazine was 1500 ppm.

Example 14

0.80 g of adipodihydrazide (Fujifilm Wako Pure Chemical Corporation) was added to 1000 g of the dispersion liquid obtained in Example 2 in a nitrogen atmosphere.

The dispersion liquid dispersed well. The percentage of cuprous oxide contained was 20%, and the particle size was 23 nm. The amount of hydrazine was 700 ppm, and the amount of adipodihydrazide was 800 ppm.

Example 15

0.80 g of 4-amino-1,2,4-triazole (Fujifilm Wako Pure Chemical Corporation) was added to 1000 g of the dispersion liquid obtained in Example 2 in a nitrogen atmosphere.

The dispersion liquid dispersed well. The percentage of cuprous oxide contained was 20%, and the particle size was 23 nm. The amount of hydrazine was 700 ppm, and the amount of 4-amino-1,2,4-triazole was 800 ppm.

Example 16

806 g of copper(II) acetate monohydrate (Kanto Chemical Co., Ltd.) was dissolved in a mixed solvent of 7560 g of distilled water (Kyoei Pharmaceutical Co., Ltd.) and 3494 g of 1,2-propylene glycol (Kanto Chemical Co., Ltd.), and then the solution temperature was brought to −5° C. using an external thermostat. 235 g of hydrazine monohydrate (Tokyo Chemical Industry Co., Ltd.) was added over 20 minutes in a nitrogen atmosphere, and then mixed for 30 minutes, the solution temperature was brought to 25° C. using an external thermostat, and then mixed for 90 minutes in a nitrogen atmosphere. After mixing, the solution was separated into a supernatant and precipitate using centrifugal separation. 54.8 g of DISPERBYK-106 (BYK Co.), 13.7 g of Surflon S611 (Seimi Chemical Co.), and 907 g of ethanol (Kanto Chemical Co., Ltd.) were added to 390 g of the obtained precipitate, and the solution was dispersed in a nitrogen atmosphere using a homogenizer, to obtain 1365 g of a cuprous oxide dispersion liquid.

Agglomeration of copper particles was seen in a portion in the dispersion liquid. The percentage of cuprous oxide contained was 20%, and the particle size was 77 nm. The amount of hydrazine was 2900 ppm.

Example 17

806 g of copper(II) acetate monohydrate (Kanto Chemical Co., Ltd.) was dissolved in a mixed solvent of 7560 g of distilled water (Kyoei Pharmaceutical Co., Ltd.) and 3494 g of 1,2-propylene glycol (Kanto Chemical Co., Ltd.), and then the solution temperature was brought to −5° C. using an external thermostat. 235 g of hydrazine monohydrate (Tokyo Chemical Industry Co., Ltd.) was added over 20 minutes in a nitrogen atmosphere, and then mixed for 30 minutes, the solution temperature was brought to 25° C. using an external thermostat, and then mixed for 90 minutes in a nitrogen atmosphere. After mixing, the solution was separated into a supernatant and precipitate using centrifugal separation. 54.8 g of DISPERBYK-145 (BYK Co.), 13.7 g of Surflon S611 (Seimi Chemical Co.), and 907 g of ethanol (Kanto Chemical Co., Ltd.) were added to 390 g of the obtained precipitate, and the solution was dispersed in a nitrogen atmosphere using a homogenizer, to obtain 1365 g of a cuprous oxide dispersion liquid. The dispersion liquid was bubbled in air for an additional 3 hours, and the amount of dispersion medium lost due to bubbling was replaced with ethanol to obtain the original 1365 g.

Agglomeration of copper particles was seen in a portion in the dispersion liquid. The percentage of cuprous oxide contained was 20%, and the particle size was 40 nm. The amount of hydrazine was 200 ppm.

Comparative Example 1

806 g of copper(II) acetate monohydrate (Kanto Chemical Co., Ltd.) was dissolved in a mixed solvent of 7560 g of distilled water (Kyoei Pharmaceutical Co., Ltd.) and 3494 g of 1,2-propylene glycol (Kanto Chemical Co., Ltd.), and then the solution temperature was brought to −5° C. using an external thermostat. 235 g of hydrazine monohydrate (Tokyo Chemical Industry Co., Ltd.) was added over 20 minutes in a nitrogen atmosphere, and then mixed for 30 minutes, the solution temperature was brought to 25° C. using an external thermostat, and then mixed for 90 minutes in a nitrogen atmosphere. After mixing, the solution was separated into a supernatant and precipitate using centrifugal separation. 110 g of DISPERBYK-145 (BYK Co.), 13.7 g of Surflon S611 (Seimi Chemical Co.), and 851 g of ethanol (Kanto Chemical Co., Ltd.) were added to 390 g of the obtained precipitate, and the solution was dispersed in a nitrogen atmosphere using a homogenizer, to obtain 1365 g of a cuprous oxide dispersion liquid (copper oxide ink).

Copper oxide particles agglomerated in the dispersion liquid and ink could not be formed. The percentage of cuprous oxide contained was 20%, and the particle size could not be measured due to agglomeration. The amount of hydrazine was 3000 ppm.

Comparative Example 2

806 g of copper(II) acetate monohydrate (Kanto Chemical Co., Ltd.) was dissolved in a mixed solvent of 7560 g of distilled water (Kyoei Pharmaceutical Co., Ltd.) and 3494 g of 1,2-propylene glycol (Kanto Chemical Co., Ltd.), and then the solution temperature was brought to −5° C. using an external thermostat. 235 g of hydrazine monohydrate (Tokyo Chemical Industry Co., Ltd.) was added over 20 minutes in a nitrogen atmosphere, and then mixed for 30 minutes, the solution temperature was brought to 25° C. using an external thermostat, and then mixed for 90 minutes in a nitrogen atmosphere. After mixing, the solution was separated into a supernatant and precipitate using centrifugal separation. 0.82 g of DISPERBYK-145 (BYK Co.), 13.7 g of Surflon 5611 (Seimi Chemical Co.), and 960 g of ethanol (Kanto Chemical Co., Ltd.) were added to 390 g of the obtained precipitate, and the solution was dispersed in a nitrogen atmosphere using a homogenizer, to obtain 1365 g of a cuprous oxide dispersion liquid.

Copper oxide particles agglomerated in the dispersion liquid and ink could not be formed. The percentage of cuprous oxide contained was 20%, and the particle size could not be measured due to agglomeration. The amount of hydrazine was 3000 ppm.

Comparative Example 3

4 g of cuprous oxide (EM Japan Co., Ltd., MP-Cu$_2$O-25), 0.8 g or DISPERBYK-145 (BYK Co.) and 0.2 g of Surflon 5611 (Seimi Chemical Co.) were added to 15 g of ethanol (Kanto Chemical Co., Ltd.), the mixture was dispersed in a nitrogen atmosphere using a homogenizer, and 20 g of a cuprous oxide dispersion liquid (copper oxide ink) was obtained.

Agglomeration of copper oxide particles was seen in a portion in the dispersion liquid. The percentage of cuprous oxide contained was 20%, and the average secondary particle size was 190 nm. The amount of hydrazine was 0 ppm.

Comparative Example 4

3.0 g of hydrazine (Tokyo Chemical Industry Co., Ltd.) was added to 97 g of the dispersion liquid obtained in Example 1 in a nitrogen atmosphere.

Copper oxide particles agglomerated in the dispersion liquid and ink could not be formed. The percentage of cuprous oxide contained was 20%, and the particle size could not be measured due to agglomeration. The amount of hydrazine was 33000 ppm.

Comparative Example 5

806 g of copper(II) acetate monohydrate (Kanto Chemical Co., Ltd.) was dissolved in a mixed solvent of 7560 g of distilled water (Kyoei Pharmaceutical Co., Ltd.) and 3494 g of 1,2-propylene glycol (Kanto Chemical Co., Ltd.), and then the solution temperature was brought to −5° C. using an external thermostat. 235 g of hydrazine monohydrate (Tokyo Chemical Industry Co., Ltd.) was added over 20 minutes in a nitrogen atmosphere, and then mixed for 30 minutes, the solution temperature was brought to 25° C. using an external thermostat, and then mixed for 90 minutes in a nitrogen atmosphere. After mixing, the solution was separated into a supernatant and precipitate using centrifugal separation. 13.7 g of Surflon S611 (Seimi Chemical Co.), and 961 g of ethanol (Kanto Chemical Co., Ltd.) were added to 390 g of the obtained precipitate, and the solution was dispersed in a nitrogen atmosphere using a homogenizer, to obtain 1365 g of a cuprous oxide dispersion liquid (copper oxide ink).

Copper oxide particles agglomerated in the dispersion liquid and ink could not be formed. The percentage of cuprous oxide contained was 20%, and the particle size could not be measured due to agglomeration. The amount of hydrazine was 3000 ppm.

[Dispersiveness]

The evaluation criteria for dispersiveness of the copper oxide ink is as follows:

A: The copper oxide particle size is not more than 50 nm immediately following dispersion by a homogenizer, and settling of particles does not occur within 30 minutes of dispersion by a homogenizer.

B: The copper oxide particle size is more than 50 nm immediately following dispersion by a homogenizer, and settling of particles does not occur within 30 minutes of dispersion by a homogenizer.

C: Settling of particles occurs within 30 minutes of dispersion by a homogenizer.

[Reverse Printing]

Using a copper oxide ink, a coating film with a patterned shape was formed on a substrate by reverse printing. First, an evenly-thick coating film of copper oxide ink was formed on a surface of a blanket. The surface material of the blanket was composed of normal silicone gum, and whether or not the copper oxide ink adhered well to the silicone gum and whether or not the coating film formed homogeneously were confirmed. Next, the surface of the blanket on which a coating film of copper oxide ink was formed was pressed by a letter press and made to contact the surface, and a portion of the coating film of the copper oxide ink on the surface of the blanket adhered to and was transferred to the surface of the protruding portion of a letter press. Thereby, a print pattern was formed on the coating film of copper oxide ink remaining on the surface of the blanket. Next, the blanket in this condition was pressed against the surface of the to-be-printed substrate to transfer the coating film of the copper oxide ink remaining on the blanket, whereby a patterned coating film was formed. The evaluation criteria is as follows.

A: reverse printing was possible.

B: part of the print pattern was not formed.

C: reverse printing failed.

[Measurement of Resistance]

A 600 nm-thick film was created on a PEN film using a bar coater, and reduced by heating firing at 1.5 kw for 420 seconds using a plasma firing device to create a copper film (conductive film). The volume resistance rate of the conductive film was measured using a low resistance meter Lolestar GP by Mitsubishi Chemical. The performance results of the copper oxide ink and the coating film are shown in Table 1.

[Storage Stability]

The copper oxide ink was stored in a refrigerator at −17° C. for 6 months, the particle size of copper oxide particles of the copper oxide ink after storage was measured, and a particle size change rate was found. The evaluation criteria for the storage stability is as follows. particle size change rate=|particle size after storage−particle size before storage|/particle size before storage A: The particle size change rate is less than 25%

B: The particle size change rate is not less than 25% and less than 50%

C: The particle size change rate is not less than 50% and less than 100%

D: The particle size change rate is not less than 100%

TABLE 1

| | Copper oxide | Content | Dispersant | | | | Reducing agent | | Reducing agent/ Copper oxide |
|---|---|---|---|---|---|---|---|---|---|
| | | | Type | Content | Acid value | Dispersant/ Copper oxide | Type | Content | |
| Example 1 | Cu2O | 20 | BYK 145 | 4.0 | 76 | 0.20 | hydrazine | 3000 | 0.015 |
| Example 2 | Cu2O | 20 | BYK 145 | 4.0 | 76 | 0.20 | hydrazine | 700 | 0.0035 |
| Example 3 | Cu2O | 20 | BYK 118 | 4.0 | 36 | 0.20 | hydrazine | 2900 | 0.015 |
| Example 4 | Cu2O | 20 | BYK 102 | 4.0 | 101 | 0.20 | hydrazine | 2700 | 0.014 |
| Example 5 | Cu2O | 20 | BYK 145 | 0.1 | 76 | 0.0050 | hydrazine | 3000 | 0.015 |
| Example 6 | Cu2O | 20 | BYK 145 | 6.0 | 76 | 0.30 | hydrazine | 3000 | 0.015 |

TABLE 1-continued

| | | | | | | | | | |
|---|---|---|---|---|---|---|---|---|---|
| Example 7 | Cu2O | 20 | BYK 145 | 4.0 | 76 | 0.20 | hydrazine | 18000 | 0.090 |
| Example 8 | Cu2O | 20 | BYK 145 | 4.0 | 76 | 0.20 | hydrazine | 3000 | 0.015 |
| Example 9 | Cu2O | 20 | BYK 145 | 4.0 | 76 | 0.20 | hydrazine | 3000 | 0.015 |
| Example 10 | Cu2O | 20 | BYK 145 | 4.0 | 76 | 0.20 | hydrazine | 3000 | 0.015 |
| Example 11 | Cu2O | 20 | BYK 145 | 4.0 | 76 | 0.20 | hydrazine | 3000 | 0.015 |
| Example 12 | Cu2O | 20 | BYK 145 | 4.0 | 76 | 0.20 | hydrazine | 1000 | 0.0050 |
| Example 13 | Cu2O | 20 | BYK 145 | 4.0 | 76 | 0.20 | hydrazine | 1500 | 0.0075 |
| Example 14 | Cu2O | 20 | BYK 145 | 4.0 | 76 | 0.20 | hydrazine + adipodihydrazide | 1500 | 0.0075 |
| Example 15 | Cu2O | 20 | BYK 145 | 4.0 | 76 | 0.20 | hydrazine + 4-amino-1,2,4-triazole | 1500 | 0.0075 |
| Example 16 | Cu2O | 20 | BYK 106 | 4.0 | 132 | 0.20 | hydrazine | 2900 | 0.015 |
| Example 17 | Cu2O | 20 | BYK 145 | 4.0 | 76 | 0.20 | hydrazine | 200 | 0.001 |
| Comparative Example 1 | Cu2O | 20 | BYK 145 | 0.060 | 76 | 0.0030 | hydrazine | 3000 | 0.015 |
| Comparative Example 2 | Cu2O | 20 | BYK 145 | 8.0 | 76 | 0.40 | hydrazine | 3000 | 0.015 |
| Comparative Example 3 | Cu2O | 20 | BYK 145 | 4.0 | 76 | 0.20 | — | 0 | 0.0 |
| Comparative Example 4 | Cu2O | 20 | BYK 145 | 4.0 | 76 | 0.20 | hydrazine | 33000 | 0.17 |
| Comparative Example 5 | Cu2O | 20 | — | — | — | — | hydrazine | 3000 | 0.015 |

| | Copper oxide particle size | Dispersion medium | | | Performance | | | |
|---|---|---|---|---|---|---|---|---|
| | | Type | Carbon atoms | Content | Dispersiveness | Storage stability | Reverse printing | Resistance |
| Example 1 | 21 | ethanol | 2 | 66 | A | A | A | 26 |
| Example 2 | 23 | ethanol | 2 | 66 | A | B | A | 24 |
| Example 3 | 23 | ethanol | 2 | 65 | A | A | A | 20 |
| Example 4 | 16 | ethanol | 2 | 66 | A | A | A | 13 |
| Example 5 | 24 | ethanol | 2 | 70 | A | B | B | 18 |
| Example 6 | 23 | ethanol | 2 | 64 | A | B | A | 37 |
| Example 7 | 29 | ethanol | 2 | 65 | A | B | A | 30 |
| Example 8 | 20 | butanol | 4 | 66 | A | A | A | 21 |
| Example 9 | 24 | propanol | 3 | 66 | A | A | A | 22 |
| Example 10 | 47 | decanol | 10 | 66 | A | B | A | 28 |
| Example 11 | 30 | octanol | 8 | 66 | A | B | A | 28 |
| Example 12 | 23 | ethanol | 2 | 66 | A | A | A | 25 |
| Example 13 | 23 | ethanol | 2 | 66 | A | A | A | 25 |
| Example 14 | 23 | ethanol | 2 | 66 | A | B | A | 22 |
| Example 15 | 23 | ethanol | 2 | 66 | A | B | A | 23 |
| Example 16 | 77 | ethanol | 2 | 66 | B | D | C | 30 |
| Example 17 | 40 | ethanol | 2 | 66 | B | D | B | 40 |
| Comparative Example 1 | — | ethanol | 2 | 62 | C | — | Ink not formed | |
| Comparative Example 2 | — | ethanol | 2 | 70 | C | — | Ink not formed | |
| Comparative Example 3 | 190 | ethanol | 2 | 75 | C | D | C | No conductance |
| Comparative Example 4 | — | ethanol | 2 | 64 | C | — | Ink not formed | |
| Comparative Example 5 | — | ethanol | 2 | 70 | C | — | Ink not formed | |

In Examples 1 to 17, the copper oxide ink did not agglomerate, and a low resistance was maintained when the copper film was created on the PEN film. In the Examples, the value of (mass of reducing agent/mass of copper oxide) was not less than 0.00010 and not more than 0.10, the value of (mass of dispersant/mass of copper oxide) was not less than 0.0050 and not more than 0.30. Additionally, in Examples 1 to 15, the acid value of the dispersant was not less than 20 and not more than 130. It is considered that, by using hydrazine as the reducing agent, reduction of copper oxide is promoted, and a copper film with a low resistance can be created.

Of the Examples, the acid value of the dispersant of Example 16 was 130. In comparison to Examples 1 to 15, in Example 16, the dispersion was poor, and resistance of the copper film created by firing was high.

In Comparative Examples 1 and 2, the mass of dispersant exceeded the range of 0.0050≤(mass of dispersant/mass of copper oxide)≤0.30, such that the copper oxide inks agglomerated, and measurements could not be taken for reverse printing or resistance. In Comparative Example 5, a dispersant was not contained, so the copper oxide ink agglomerated, and measurements could not be taken for reverse printing or resistance.

In Comparative Example 3, hydrazine was not added to the copper oxide ink. In this case, hydrazine, which is considered to contribute to storage stability, was not added, and therefore the average particle size of the copper oxide was larger than the Examples, and storage stability decreased. In Comparative Example 4, the mass of reducing agent exceeded the range of 0.00010≤(mass of reducing agent/mass of copper oxide)≤0.10. In this case, the copper oxide ink agglomerated, such that measurements could not be taken for reverse printing or resistance.

In Examples 1 to 15, the average particle size of cuprous oxide was not less than 3.0 nm and not more than 50 nm. Furthermore, printability was good, and when the dispersion medium was a mono-alcohol having 7 or fewer carbon atoms as in Examples 1 to 9 and 12 to 15, printability was better than when the dispersion medium had 8 or more carbon atoms as in Examples 10 and 11.

Of the Examples, in Example 16, which had a dispersant with an acid value greater than 130, the average particle size of cuprous oxide was greater than 50 nm, resistance increased, and printability decreased relative to Examples 1 to 15.

Hydrazine was added after the copper oxide ink was created in Examples 7, 12, and 13. The dispersibility, printability, and storage stability were good, and a low resistance was maintained during creation of the copper film. In Example 14, after the copper oxide ink was created, adipodihydrazide was added as a reducing agent, and in Example 15, 4-amino-1,2,4-triazole was added. In these cases, dispersibility, printability, and storage stability were good, and the copper film maintained a low resistance. Examples 7, 12, and 13, in which hydrazine was used as a reducing agent when adding a reducing agent after the copper oxide ink was created, maintained a lower resistance than when other reducing agents were used.

When creating the copper oxide ink, by adding a reducing agent under predetermined time conditions and dispersing in a nitrogen atmosphere, the reducing agent was effectively kept present in the copper oxide ink, thereby enabling the masses of reducing agent and dispersant relative to copper oxide to be kept in predetermined ranges and a copper oxide ink with excellent storage stability to be created. Even by adding a reducing agent to copper oxide ink in a nitrogen environment after creating the copper oxide ink, the reducing agent was effectively kept present in the copper oxide ink.

The polydispersity in Examples 1 to 17 was from 0.20 to 0.30.

Based on the above experimental results, it is preferable that 0.00010≤(mass of reducing agent/mass of copper oxide)≤0.10; 0.0050≤(mass of dispersant/mass of copper oxide)≤0.30; the acid value of the dispersant is not less than 20 and not more than 130; and the average particle size of copper oxide is not less than 3.0 nm and not more than 50 nm.

Additionally, it is preferable that 0.0010≤(mass of reducing agent/mass of copper oxide)≤0.05; 0.050≤(mass of dispersant/mass of copper oxide)≤0.30; the acid value of the dispersant is not less than 25 and not more than 120; and the average particle size of copper oxide is not less than 5.0 nm and not more than 40 nm.

Additionally, it is preferable that 0.0040≤(mass of reducing agent/mass of copper oxide)≤0.030; 0.10≤(mass of dispersant/mass of copper oxide)≤0.30; the acid value of the dispersant is not less than 36 and not more than 110; and the average particle size of copper oxide is not less than 5.0 nm and not more than 40 nm.

Additionally, it is preferable that 0.0040≤(mass of reducing agent/mass of copper oxide)≤0.030; 0.20≤(mass of dispersant/mass of copper oxide)≤0.25; the acid value of the dispersant is not less than 36 and not more than 101; and the average particle size of copper oxide is not less than 10 nm and not more than 29 nm.

[Laser Firing]

By bar coating the copper oxide ink of Example 1 onto a PET substrate such that the ink formed a predetermined thickness of (800 nm), and drying for 10 minutes at room temperature, sample A, on which a coating layer was formed on PET, was obtained.

By irradiating sample A with laser light (wavelength 445 nm, output 1.1 W, continuous wave:CW) while moving the focal point at a maximum rate of 300 mm/second using a galvano scanner, a 25 mm×1 mm conductive film comprising copper was obtained. The resistance was 20 μΩcm. Additionally, a conductive film was able to be created during laser firing.

In the above experiment, sample A was irradiated with laser light (wavelength 355 nm, output 50%, pulse repeat frequency 300 kHz) in a nitrogen atmosphere at a rate of 100 mm/second using different laser markers (Laser Marker MD-U1000 by Keyence Co.). The resistance was 15 μΩcm. Additionally, a conductive film was able to be created during laser firing.

[Light Firing]

Sample B, on which a coating layer (film thickness: 700 nm) of 60 m width lines applied on a PET substrate by Novacentrix using the copper oxide ink of Example 1 and the aforementioned reverse printing method was formed, was obtained.

Sample B was irradiated with light (pulse time 10 milliseconds, pulse intensity 1200 W/cm$^2$) using a PulseForge 1200 by Novacentrix. As a result, a 20 μΩ conductor was obtained.

By plasma or light firing treatment of the copper oxide ink of the present invention, a conductive film with few disconnections or breakages can be obtained. Thus, the copper oxide ink of the present invention is suitable for use in the manufacture of printed circuit boards, electronic devices, transparent conductive films, electromagnetic shields, antistatic films, and the like.

The present application is based on Japanese Patent Application No. 2017-145187 filed on Jul. 27, 2017, Japanese Patent Application No. 2017-145188 filed on Jul. 27, 2017, and Japanese Patent Application No. 2018-023239 filed on Feb. 13, 2018. The contents thereof are completely contained herein.

The invention claimed is:

1. A product comprising a coating film comprising a copper oxide, a dispersant, a reducing agent and a dispersion medium, wherein
the copper oxide has a polydispersity within an average particle size distribution of an average particle size measured by a cumulant method of not less than 0.10 and not more than 0.40,
the dispersion medium is ethanol, n-propanol, i-propanol, n-butanol, i-butanol, sec-butanol, t-butanol or a combination thereof,
a content of the reducing agent is in a range of formula (1) below, and
a content of the dispersant is in a range of formula (2) below:

$$0.00010 \leq (\text{mass of reducing agent/mass of copper oxide}) \leq 0.10 \quad (1)$$

$$0.0050 \leq (\text{mass of dispersant/mass of copper oxide}) \leq 0.30 \quad (2).$$

2. The product comprising a coating film according to claim 1, wherein an acid value of the dispersant is not less than 20 and not more than 130.

3. The product comprising a coating film according to claim 1, wherein the copper oxide is cuprous oxide.

4. The product comprising a coating film according to claim 1, wherein the reducing agent comprises at least one selected from the group of hydrazine, hydrazine hydrate, a hydrazine derivative, sodium, carbon, potassium iodide, oxalic acid, iron (II) sulfide, sodium thiosulfate, ascorbic acid, tin (II) chloride, diisobutylaluminum hydride, formic acid, sodium borohydride, and sulfite.

5. The product comprising a coating film according to claim 1, wherein the reducing agent is hydrazine or hydrazine hydrate.

6. The product according to claim 1, wherein
the copper oxide is cuprous oxide,
the dispersant has an acid value of not less than 20 and not more than 130, and is a phosphorus-containing organic matter, and
the reducing agent comprises at least one selected from hydrazine, and hydrazine hydrate.

7. The product comprising a coating film according to claim 6 wherein an average particle size of the copper oxide is not less than 3.0 nm and not more than 50 nm.

8. The product comprising a coating film according to claim 6, wherein
a content of the dispersion medium in the coating film is not less than 30 mass %, and not more than 95 mass %.

9. The product comprising a coating film according to claim 1, wherein the content of the reducing agent is in a range of: $0.0010 \leq$(mass of reducing agent/mass of copper oxide)$\leq 0.050$.

10. The product comprising a coating film according to claim 1, wherein the content of the reducing agent is in a range of: $0.0040 \leq$(mass of reducing agent/mass of copper oxide)$\leq 0.030$.

11. The product comprising a coating film according to claim 1, wherein the content of the dispersant is in range of: $0.050 \leq$(mass of dispersant/mass of copper oxide)$\leq 0.30$.

12. The product comprising a coating film according to claim 1, wherein the content of the dispersant is in range of: $0.20 \leq$(mass of dispersant/mass of copper oxide)$\leq 0.25$.

* * * * *